(12) United States Patent
Yang

(10) Patent No.: US 11,652,118 B2
(45) Date of Patent: May 16, 2023

(54) IMAGE SENSOR INCLUDING AIR GRID STRUCTURE

(71) Applicant: SK hynix Inc., Icheon-si (KR)

(72) Inventor: Yun Hui Yang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 260 days.

(21) Appl. No.: 16/883,245

(22) Filed: May 26, 2020

(65) Prior Publication Data
US 2021/0104565 A1    Apr. 8, 2021

(30) Foreign Application Priority Data

Oct. 2, 2019 (KR) ................ 10-2019-0121919

(51) Int. Cl.
*H01L 27/146* (2006.01)
(52) U.S. Cl.
CPC .... *H01L 27/14621* (2013.01); *H01L 27/1462* (2013.01); *H01L 27/14623* (2013.01); *H01L 27/14645* (2013.01); *H01L 27/14685* (2013.01)

(58) Field of Classification Search
CPC ......... H01L 27/14621; H01L 27/14623; H01L 27/14627; H01L 27/14645; H01L 27/14685; H01L 27/1463; H01L 27/14603; H01L 27/1462; H01L 27/14625
See application file for complete search history.

(56) References Cited

U.S. PATENT DOCUMENTS

| 8,507,964 | B2 | 8/2013 | Nozaki | |
| 8,711,258 | B2* | 4/2014 | Takase | G02B 3/0068 348/340 |
| 9,263,485 | B2 | 2/2016 | Furata | |
| 2005/0040317 | A1* | 2/2005 | Yaung | H01L 27/14625 250/214.1 |
| 2012/0235263 | A1* | 9/2012 | Ogita | H01L 27/14627 257/E31.127 |
| 2016/0172398 | A1* | 6/2016 | Kim | H01L 27/14621 438/70 |
| 2019/0157329 | A1* | 5/2019 | Kim | H01L 27/14612 |

\* cited by examiner

*Primary Examiner* — Jennifer D Bennett
(74) *Attorney, Agent, or Firm* — Perkins Coie LLP

(57) ABSTRACT

An image sensing device is disclosed. The image sensor includes a stacked air grid including a plurality of air layers that is physically isolated from each other and then stacked, and a color filter disposed at one side of the stacked air grid.

17 Claims, 17 Drawing Sheets

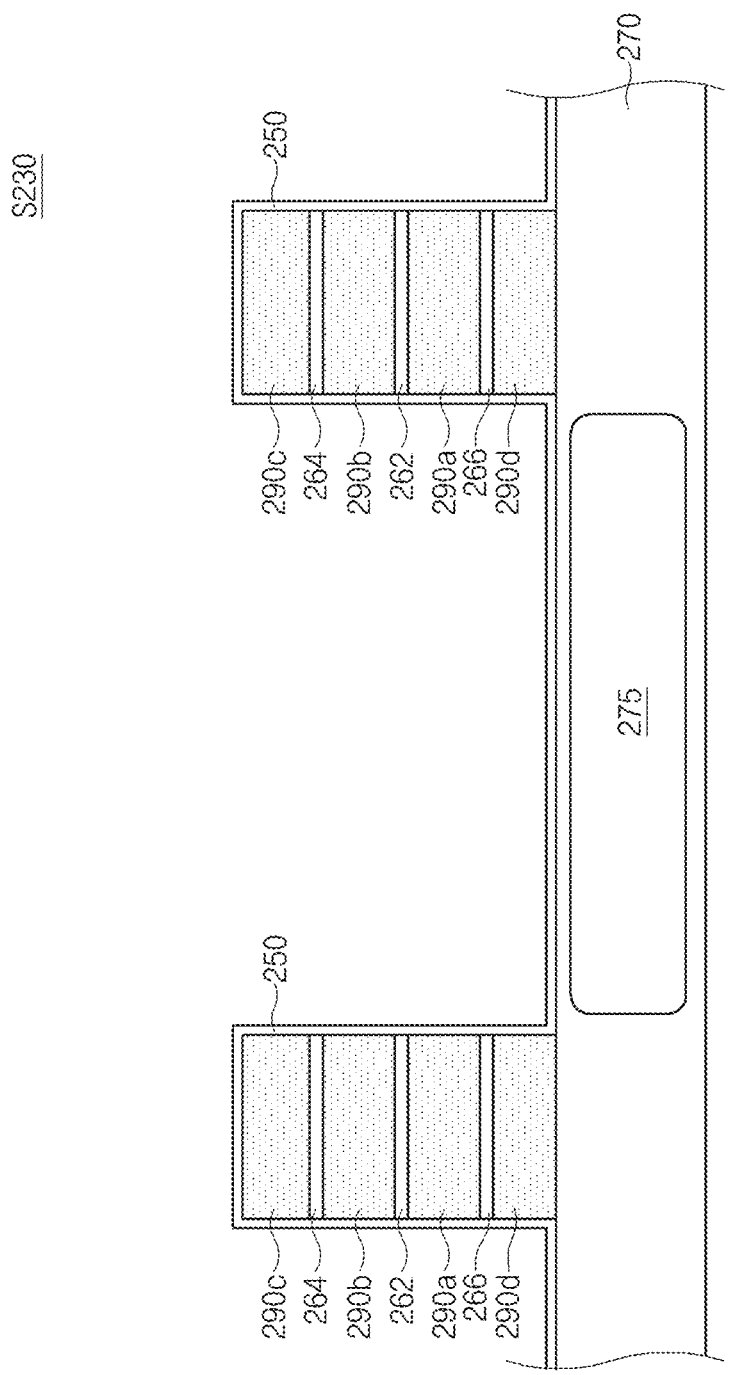

IMAGE SENSOR INCLUDING AIR GRID STRUCTURE

CROSS-REFERENCE TO RELATED APPLICATION

This patent document claims priority based upon Korean patent application No. 10-2019-0121919, filed on Oct. 2, 2019, the disclosure of which is incorporated in its entirety by reference herein.

TECHNICAL FIELD

The technology and implementations disclosed in this patent document generally relate to an image sensor provided with color filters arranged contiguous or adjacent to each other.

BACKGROUND

An image sensor is a semiconductor device for capturing light that is incident thereon to produce an image. With the recent development of computer industries and communication industries, demand for high-quality and high-performance image sensors has been rapidly increasing in concert with improvements in various electronic devices, for example, smartphones, digital cameras, video game consoles, devices for use with the Internet of Things (IoT), robots, surveillance cameras, medical micro-cameras, etc.

Commonly used image sensors may be generally classified into CCD (Charge Coupled Device) image sensors and CMOS (Complementary Metal Oxide Semiconductor) image sensors. CCD image sensors may have less noise and better image quality than CMOS image sensors. However, CMOS image sensors have a simpler and more convenient driving scheme, and thus may be preferred in some applications. In addition, CMOS image sensors may allow a signal processing circuit to be integrated into a single chip, which makes it easy to miniaturize CMOS image sensors for implementation in a product, with the added benefit of consuming very low power. CMOS image sensors can be fabricated using a CMOS fabrication technology, which results in low manufacturing costs. CMOS image sensors have been widely used due to their suitability for implementation in a mobile device.

SUMMARY

Various embodiments of the disclosed technology are related to providing image sensor designs that improve imaging performance, including certain implementations of the disclosed technology that substantially address one or more issues due to limitations and disadvantages of some other image sensor designs.

Embodiments of the disclosed technology relate to an image sensor provided with an air grid such that stability of the air grid increases in proportion to air pressure of the image sensor including the air grid.

In accordance with an embodiment of the disclosed technology, an image sensing device may include a substrate including a photoelectric conversion element that produces an electrical signal in response to light incident to the photoelectric conversion element; an air grid structure including a plurality of air layers that are stacked over the substrate along a direction perpendicular to a surface of the substrate and physically isolated from one another; and a color filter disposed at one side of the air grid structure and above the substrate.

In accordance with another embodiment of the disclosed technology, an image sensing device may include: a substrate including photoelectric conversion elements, each configured to produce an electrical signal in response to light incident to a corresponding photoelectric conversion element; color filters disposed over the photoelectric conversion elements, respectively, and arranged in a matrix shape including rows and columns; and air grid structures disposed between any two adjacent color filters, each air grid structure configured to include air layers that are physically isolated from one another.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIGS. 8A to 8E are cross-sectional views illustrating example processes for forming an air grid structure shown in FIG. 5 based on an implementation of the disclosed technology.

DETAILED DESCRIPTION

Figure 1:
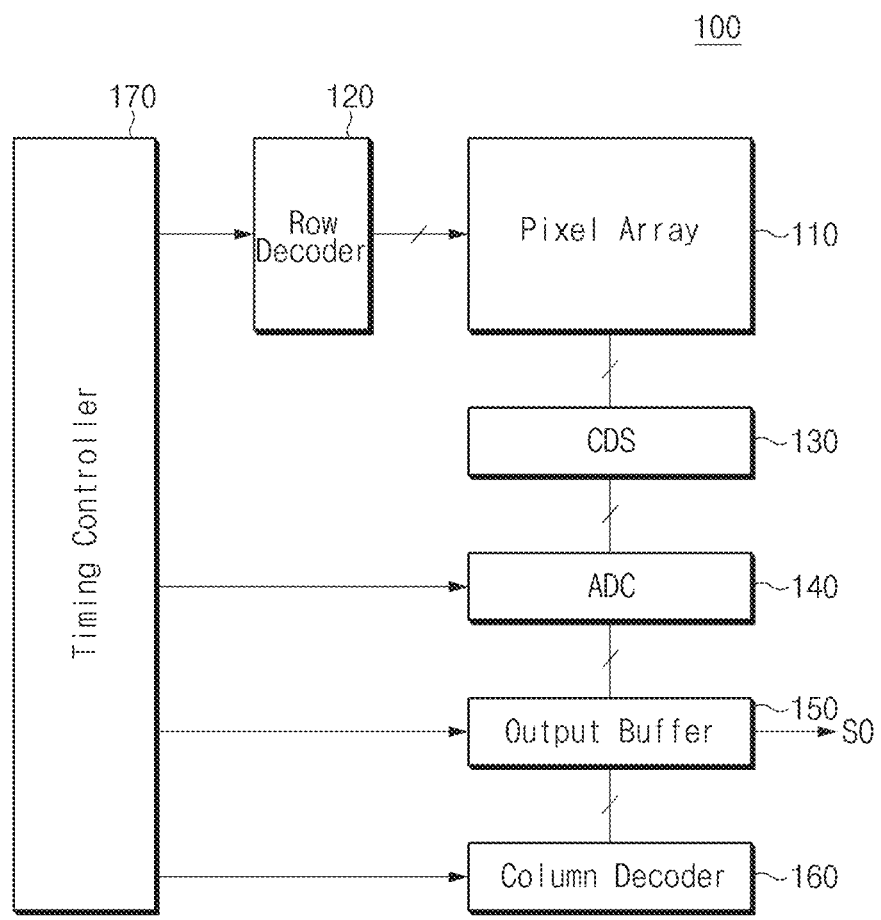
FIG. 1 is a block diagram illustrating an example of an image sensor based on an embodiment of the disclosed technology.

The following sections provide description of various aspects of the disclosed technology in some detail with respect to certain embodiments of the disclosed technology, examples of which are illustrated in the accompanying drawings. In general, the same reference numbers will be used throughout the drawings to refer to the same or like parts. While the disclosure is susceptible to various modifications and alternative forms, specific embodiments thereof are shown by way of example in the drawings. In the drawings, the sizes and shapes of elements may be exaggerated for convenience and clarity of description.

FIG. 1 is a block diagram illustrating an image sensor 100 according to an embodiment of the disclosed technology.

Referring to FIG. 1, the image sensor 100 may include a pixel array 110, a row decoder 120, a correlated double sampling (CDS) circuit 130, an analog-to-digital converter (ADC) 140, an output buffer 150, a column decoder 160, and a timing controller 170. The above-mentioned components of the image sensor 100 are examples only. Some of the components can be omitted or additional components can be added based on additional demands.

The pixel array 110 may include a plurality of unit pixels (UPs) arranged in a two-dimensional (2D) shape including rows and columns. Each unit pixel may convert optical images into electrical signals. In some implementations, such conversion operations can be performed on a shared pixel basis in which two or more unit pixels share at least one element. The pixel array 110 may receive a drive signal that includes a row selection signal, a pixel reset signal, a transmission (Tx) signal, etc. from the row decoder 120, and may be driven by the drive signal received from the row decoder 120.

The row decoder 120 may drive the pixel array 110 under control of the timing controller 170. In more detail, the row decoder may select at least one row from the pixel array 110. The row decoder 120 may generate a row selection signal to select at least one of a plurality of rows. The row decoder 120 may sequentially enable a pixel reset signal for pixels corresponding to at least one selected row, and a transmission (Tx) signal for the pixels. As a result, an analog-type reference signal and an image signal that are generated from each pixel of the selected row may be sequentially transmitted to the CDS circuit 130. In this case, the reference signal and the image signal may be generically called a pixel signal as necessary.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The CDS circuit 130 may sequentially sample and hold the reference signal and the image signal that are transferred from the pixel array 110 to each of the plurality of column lines. Thus, the CDS circuit 130 may sample and hold levels of the reference signal and the image signal that correspond to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC 140 may receive the CDS signal for each column from the CDS circuit 130, may convert the received CDS signal into a digital signal, and may thus output the digital signal. The ADC 140 may perform counting and calculation operations based on the CDS signal for each column and a ramp signal received from the timing controller 170, such that the ADC 140 may generate digital image data from which noise (for example, unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In accordance with another embodiment, the ADC 140 may include a single global counter, and may convert a CDS signal corresponding to each column into a digital signal using a global code received from the global counter.

The output buffer 150 may receive image data for each column received from the ADC 140, may capture the received image data, and may output the captured image data. The output buffer 150 may temporarily store image data that is output from the ADC 140 upon receiving a control signal from the timing controller 170. The output buffer 150 may operate as an interface configured to compensate for a difference in transmission (Tx) speed (or in processing speed) between the image sensor 100 and another device coupled to the image sensor 100.

The column decoder 160 may select a column of the output buffer 150 upon receiving a control signal from the timing controller 170, and may sequentially output the temporarily stored image data to the output buffer 150. In more detail, the column decoder 160 may receive an address signal from the timing controller 170, may generate a column selection signal based on the received address signal, and may select a column of the output buffer 150, such that the column decoder 160 may control image data to be output as an output signal S0 from the selected column of the output buffer 150.

The timing controller 170 may control the row decoder 120, the ADC 140, the output buffer 150, and the column decoder 160.

The timing controller 170 may transmit a clock signal needed for the constituent elements of the image sensor 100, a control signal needed for timing control, and address signals needed for selection of a row or column to the row decoder 120, the column decoder 160, the ADC 140, and the output buffer 150. In accordance with the embodiment, the timing controller 170 may include a logic control circuit, a phase locked loop (PLL) circuit, a timing control circuit, a communication interface circuit, etc.

Figure 2:
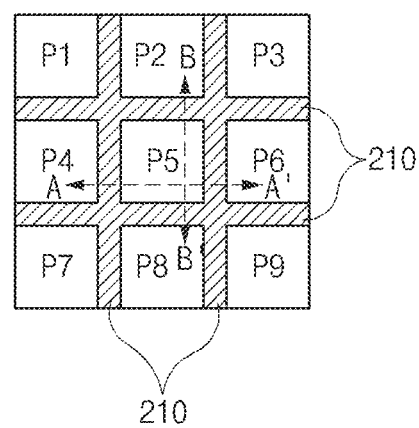
FIG. 2 is a schematic diagram illustrating one example of some parts of a pixel array shown in FIG. 1 based on an implementation of the disclosed technology.

FIG. 2 is a schematic diagram illustrating an example of a portion of a pixel array 110 shown in FIG. 1 based on some implementations of the disclosed technology.

Referring to FIG. 2, the illustrated portion of the pixel array 110 may include 9 unit pixels P1 to P9 arranged in a (3×3) matrix including three rows and three columns. Although FIG. 2 shows only 9 unit pixels P1 to P9 for convenience of description, other implementations are possible and the number of the unit pixels included in the portion 200 is not limited to 9. Thus, the pixel array 110 may include unit pixels arranged in a matrix composed of M rows and N columns, where M and N are positive integers representing the desired numbers of rows and columns of the image sensor pixels in the pixel array 110.

Between adjacent unit pixels among the unit pixels P1 to P9, an air grid structure 210 is provided to spatially separate and optically isolate adjacent unit pixels. The air grid structure 210 can be optically opaque or optically absorptive to optically isolate the adjacent or contiguous unit pixels, thus reducing optical cross talk between adjacent unit pixels. The air grid structure 210 may have stacked layers and may include air therein.

The air grid structure 210 may be arranged not only between contiguous or adjacent unit pixels (e.g., P1 and P2, P2 and P3, etc.) arranged in a row direction (or in a horizontal direction) of the pixel array 110, but also between contiguous or adjacent unit pixels (e.g., P1 and P4, P4 and P7, etc.) arranged in a column direction (or in a vertical direction) of the pixel array 110. In some implementations, the air grid structure 210 may be arranged not only in the row direction of the pixel array 110, but also in the column direction of the pixel array 110. The air grid structure 210 may extend along one side of each unit pixel on which the air grid structure 210 is disposed. The air grid structure 210 may be defined to be contained in vertical or horizontal contiguous pixels thereof, and may also be defined to distinguish the vertical or horizontal contiguous pixels from each other as needed.

The air grid structure 210 may be formed to extend in the row direction of the pixel array 110, and to extend in the column direction of the pixel array 110. Thus, the air gird structure 210 may have a mesh-type structure in in the row direction and the column direction of the pixel array 110. Therefore, the air grid structure 210 may be formed continuously in the pixel array 110 such that an air grid structure located contiguous or adjacent to a specific unit pixel may be coupled to another air grid structure 210 located contiguous or adjacent to another unit pixel that is different from the specific unit pixel.

In some implementations, the air gird structure 210 can be present on two opposite sides of a unit pixel, one or more color filters (e.g., a red filter, a green filter, a blue filter, a yellow filter, etc.) of the unit pixel may be disposed between the air grids of the air grid structure 210. In some implementations, the air grid structure 210 may be arranged to surround a peripheral region of each color filter of a certain unit pixel.

In various implementations, a microlens for allowing incident light to converge upon the corresponding pixel may be disposed over the color filter. A substrate provided with at least one photoelectric conversion element capable of converting intensity of such incident light into an electrical signal may be disposed below the color filter. The photoelectric conversion element can be implemented to generate photocharges in response to light. For example, the photoelectric conversion elements include photodiodes, photogates, phototransistors, photoconductors, or some other photosensitive structures capable of generating photocharges.

Incident light having passed through the microlens may pass through the color filter. In this case, incident light having passed through a color filter of a specific pixel may be shifted to another pixel through a contiguous or adjacent color filter, which results in the occurrence of the crosstalk. The crosstalk can cause noises in a pixel signal. The air grid structure 210 may allow such incident light to be reflected or absorbed into each pixel and prevent the occurrence of optical crosstalk.

A first cutting line A-A' and a second cutting line B-B' may be illustrated as shown in FIG. 2. The cross-sectional view taken along the first cutting line A-A' may be substantially identical to the cross-sectional view taken along the second cutting line B-B'. In FIGS. 3-6, the air grid structure 210 will hereinafter be described with reference to the cross-sectional views of the pixel array taken along each of the first cutting line A-A' and the second cutting line B-B'. FIGS. 7A to 8E show fabrication processes for forming the air grid structure 210.

Figure 3:
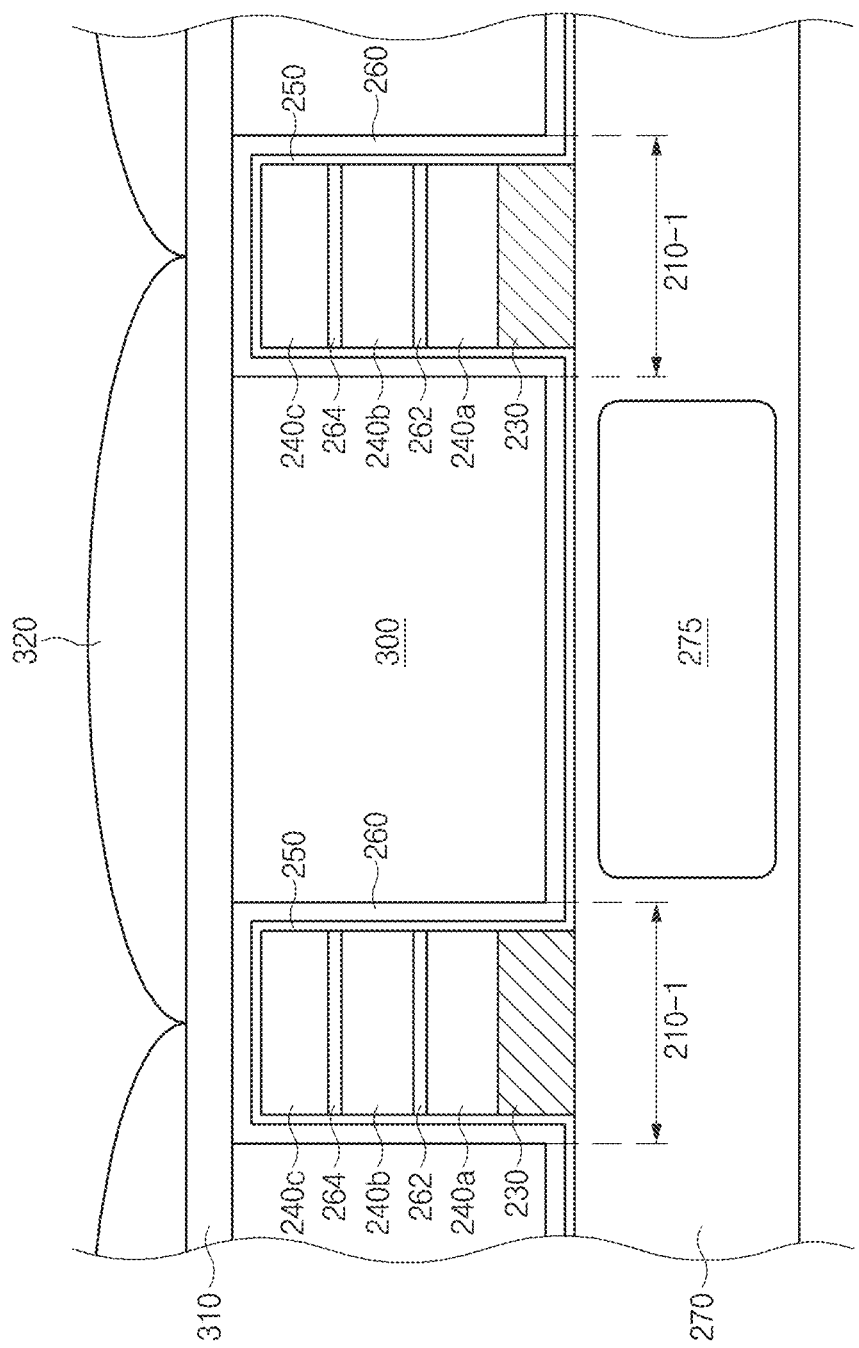
FIG. 3 is a cross-sectional view illustrating one example of a pixel array taken along a first cutting line or a second cutting line shown in FIG. 2 based on an implementation of the disclosed technology.

FIG. 3 is a cross-sectional view illustrating one example of the pixel array 110 taken along the first cutting line A-A' or the second cutting line B-B' shown in FIG. 2 according to some implementations of the disclosed technology.

Referring to FIG. 3, two stacked air grids 210-1 of the air grid structure 210 may be disposed over the cross-sectional view taken along the first cutting line A-A' or the second cutting line B-B' while being spaced apart from each other by a specific distance corresponding to a width of the pixel P5. As previously stated above, the color filter of the pixel P5 may be disposed between the two stacked air grids 210-1. The height of a top surface of the color filter may be higher than the height of the stacked air grid 210-1, may be lower than the height of the stacked air grid 210-1, or may be identical to the height of the stacked air grid 210-1.

The cross-sectional view taken along the first cutting line A-A' of the pixel array 110 or the cross-sectional view taken along the second cutting line B-B' of the pixel array 110 as shown in FIG. 3 includes a substrate 270, a photoelectric conversion element such as a photodiode 275, at least one stacked air grid 210-1, a color filter 300, an over-coating layer 310, and a microlens 320.

The substrate 270 may include a top surface and a bottom surface that face each other. Although the top surface of the substrate 270 can be defined as a front side and the bottom surface of the substrate 270 can be defined as a back side for convenience of description, other implementations are also possible. For example, the substrate 270 may be a P-type or N-type bulk substrate, may be a P-type bulk substrate in which a P-type or N-type epitaxial layer is grown, or may be an N-type bulk substrate in which a P-type or N-type epitaxial layer is grown.

In FIG. 3, the photodiode 275 is shown as an example of a photoelectric conversion element that generates and accumulates photocharges corresponding to the amount of incident light in an inner region thereof, such that the photodiode 275 may be disposed in a region corresponding to the fifth pixel P5 in the substrate 270. As an example, the photodiode 275 may be formed as an N-type doped region through ion implantation of N-type ions. In accordance with one embodiment, the photodiode 275 may be formed by stacking a plurality of doped regions. In some implementations, a lower doped region may be formed by implantation of $N^+$ ions, and an upper doped region may be formed by implantation of $N^-$ ions. The photodiode 275 may be arranged to occupy a region as large as possible to increase a fill factor indicating light reception (Rx) efficiency. In accordance with the present embodiment, a device isolation film (not shown) disposed between the photodiodes of the contiguous or adjacent pixels may be formed to be deeply etched in a vertical direction, so that the device isolation film can electrically or optically isolate the contiguous or adjacent pixels that are located adjacent to each other.

The stacked air grid 210-1 may include a metal layer 230, first to third air layers 240a, 240b and 240c, a first capping film 250, a second capping film 260, and isolation layers 262 and 264. Dimensions of the layers included in the stacked air grid 210-1 as shown in FIG. 3 are examples only. Thus, a relative width, a relative height, and a relative thickness of each of constituent elements contained in the stacked air grid 210-1 are not limited to those shown in FIG. 3 and can be changed as needed.

The metal layer 230 may be disposed over the substrate. The metal layer 230 may be formed of or include a metal material (e.g., tungsten) having a high light absorption rate, or may also be formed by stacking different kinds of materials.

The first to third air layers 240a to 240c may be disposed over the metal layer 230, and the shape of the first to third air layers 240a to 240c may be defined by a first capping film 354 and the isolation layers 262 and 264. Each of the first to third air layers 240a to 240c may be filled with air having a relatively low refractive index (e.g., a refractive index of 1). In accordance with another embodiment, the first to third air layers 240a to 240c may be filled with different kinds of gas.

For example, the first air layer 240a filled with first gas, the second air layer 240b filled with second gas, and the third air layer 240c filled with third gas may be sequentially disposed over the substrate 270. In some implementations, the first gas, the second gas, and the third gas may have different refractive indexes depending on the relative positions of the first to third air layers 240a to 240c in the stacked air grid 210-1. For example, the first to third gases may have refractive indexes that increase as a distance between each of the first to third air layers 240a to 240c including first to third gases and the substrate becomes smaller. In some implementations, the first to third gases may have refractive indexes that decrease as a distance between each of the first to third air layers 240a to 240c including first to third gases and the substrate becomes smaller.

The first air layer 240a and the second air layer 240b may be physically isolated from each other by the isolation layer 262. In addition, the first air layer 240a and the third air layer 240c may be physically isolated from each other by the isolation layer 262.

The first to third air layers 240a-240c may be identical in height to each other. In accordance with another embodiment, the first to third air layers 240a to 240c may be different in height from each other. The first air layer 240a, the second air layer 240b, and the third air layer 240c may be sequentially disposed over the substrate 270. The first to third air layers 240a to 240c may have different heights depending on the relative positions in the stacked air grid 210-1. For example, the first to third air layers 240a to 240c may have heights that increase as being closer to the substrate 270. In some implementations, the first to third air layers 240a to 240c may have heights that decrease as being closer to the substrate 270.

The first capping film 250 may be formed to surround the entirety of the first to third air layers 240a to 240c, the isolation layers 262 and 264, and the metal layer 230. Thus, the first capping film 250 may be formed to contact a side surface and a top surface of each of the first to third air layers 240a to 240c, the isolation layers 262 and 264, and the metal layer 230. Each of the first to third air layers 240a to 240c, the isolation layers 262 and 264, and the metal layer 230 may be physically isolated from the outside by the first capping film 250. For example, the first capping film 250 may be an ultra low temperature oxide (ULTO) film such as a silicon oxide (SiO$_2$) film.

The second capping film 260 may be formed to surround the entirety of the first capping film 250. One side surface of the second capping film 260 may be in contact with the first capping film 250, and the other side surface of the second capping film 260 may be in contact with the outside of the stacked air grid 210-1. Therefore, the first capping film 250 may be physically isolated from the outside by the second capping film 260. For example, the second capping film 260 may be formed of or include an insulation film that includes at least one of a silicon oxide nitride (Si$_x$O$_y$N$_z$, where each of 'x', 'y', and 'z' is a natural number) film, a silicon oxide (Si$_x$O$_y$, where each of 'x' and 'y' is a natural number) film, or a silicon nitride (Si$_x$N$_y$, where each of 'x' and 'y' is a natural number) film.

The second capping film 260 may be larger in thickness than the first capping film 250. The reason why the second capping film 260 has a larger thickness than the first capping film 250 is that the first capping film 250 is formed as thin as possible in a manner that internal materials of the first capping film 250 can be effectively discharged outside during the plasma process, and the second capping film 250 is formed to a predetermined thickness through which the shape of the stacked air grid 210-1 including the first to third air layers 240a to 240c can be stably maintained.

In accordance with another embodiment, a support film for maintaining the shape of the stacked air grid 210-1 may be formed at a lower part of the first capping film 250 and at an upper part of the third air layer 240c. The support film may be or include an insulation film having no light absorption characteristics.

In accordance with one embodiment, the first capping film 250 and the second capping film 260 may be formed of or include the same materials, such that the first capping film 250 and the second capping film 260 may also have the same refractive index.

In accordance with one embodiment, the refractive index of each of the first capping film 250 and the second capping film 260 may be higher than those of the first to third air layers 240a to 240c, and may be lower than that of the color filter (not shown).

The stacked air grid 210-1 may prevent light incident upon the color filter of a certain pixel (e.g., the color filter of the pixel P5) from being shifted to another color filter other than the certain pixel (e.g., the color filter of the pixel P4) to minimize or prevent the optical crosstalk.

Since the refractive index (e.g., 1) of each of the first to third air layers 240a to 240c filled with air is lower than the refractive index (e.g., 1.6~1.7) of the color filter (not shown) and the refractive index (e.g., 1.4) of each of the first capping film 250 and the second capping film 260, the first to third air layers 240a to 240c may induce reflection of light. The light reflected by the first to third air layers 240a to 240c can reenter the unit pixel without being shifted to another pixel. Thus, it is possible to minimize and prevent the optical crosstalk.

In some implementations, the metal layer 230 operates to absorb some light when the light was incident upon the certain unit pixel but refracted and introduced into the first to third air layers 240a to 240c. This can occur when some of the incident light having various incident angles has failed to be reflected back to the certain unit pixel even with the first to third air layers 240a to 240c Such incident light refracted and introduced into the air layers 240a to 240c is absorbed by the metal layer 230, which results in the prevention of optical crosstalk.

Each of the first capping film 250 and the second capping film 260 that are included in the air grid structure, which is disposed at one side of the color filter (e.g., left side of the color filter 300 in FIG. 3), may be formed to extend between the color filter and the substrate, and may be disposed below the color filter. In some implementations, the first capping film 250 and the second capping film 260 that are disposed below the color filter may be respectively coupled to the first capping film 250 and the second capping film 260 that are included in the stacked air grid 210-1, which is disposed at the other side of the color filter (e.g., the right side of the color filter 300 in FIG. 3). The first capping film 250 and the second capping film 260 of the stacked air grid 210-1 contacting the color filter may be respectively integrated with the first capping film 250 and the second capping film 260 that are disposed below the color filter.

The first capping film 250 and the second capping film 260 configured to maintain the shape of the stacked air grid 210-1 may be formed to contact another structure (e.g., the substrate) in a wider region as compared to the case in which the first capping film 250 and the second capping film 260 are not disposed below the color filter, resulting in increased stability in shape of the stacked air grid 210-1. Due to balance between first tension, that is generated by the first capping layer 250 and the second capping layer 260 that are disposed below the color filter located at the left side of the stacked air grid 210-1, and second tension, which is generated by the first capping film 250 and the second capping film 260 that are disposed below the color filter located at the right side of the stacked air grid 210-1, the stacked air grid 210-1 having a narrow width may be prevented from being tilted to the left or right.

Each of the first capping film 250 and the second capping film 260 that are disposed below the color filter may serve as an anti-reflection layer that compensates for a difference in refractive index between the color filter and the substrate such that light having passed through the color filter can be effectively incident into the substrate. Therefore, it is possible to reduce a total thickness of the unit pixel by omitting a separate anti-reflection layer between the color filter and the substrate.

The isolation layers 262 and 264 may physically isolate the first to third air layers 240a to 240c from one another. In some implementations, the isolation layers 262 and 264 may contact the first capping film 250 along a width direction (e.g., from a left side to a right side or from a right side to a left side) of the stacked air grid 210-1, such that a predetermined distance between the first capping films 250 on two opposite sides of the stacked air grid 210-1 can be maintained. As a result, the isolation layers 262 and 264 may allow each of the first to third air layers 240a to 240c to be maintained in shape. Although only two isolation layers 262 and 264 are illustrated in FIG. 3, other implementations are also possible. Thus, the number of such isolation layers is not limited to two and may be set to another number as needed.

Each of the isolation layers 262 and 264 may be formed of or include an insulation film that includes at least one of a silicon oxide nitride ($Si_xO_yN_z$, where each of 'x', 'y', and 'z' is a natural number) film, a silicon oxide ($Si_xO_y$, where each of 'x' and 'y' is a natural number) film, or a silicon nitride ($Si_xN_y$, where each of 'x' and 'y' is a natural number) film.

Assume that the isolation layers 262 and 264 are not present unlike the structure shown in FIG. 3. In this case, the first to third air layers 240a to 240c are not isolated from one another by the isolation layers 262 and 264, which makes only one air layer present.

In this case, since each of the first capping film 250 and the second capping film 260 is formed as a thin film, a vulnerable point may exist in a specific portion of the first and second capping films 250 and 260 due to a limitation in fabrication processes and use environments (e.g., a high-temperature condition). Such vulnerable point can cause the collapse (or popping) of the first and second capping films 250 and 260 due to pressure generated in the specific portion. Pressures applied to the vulnerable point may increase in proportion to temperature and volume of internal air of the air layer. When the air grid structure is provided in a mesh form in which the air layers of the entire pixel array 110 are interconnected through a single region, pressures corresponding to the volume of the air layers of the entire pixel array 110 can be applied to the vulnerable point, which causes the collapse (or popping) of the pixel array in the vulnerable point.

However, the air grid structure suggested in this patent document may allow the air layer to be physically divided into a plurality of regions by the isolation layers 262 and 264. As a result, the amount of the pressures applied to the vulnerable point can be reduced. Thus, instead of applying pressures corresponding to volume of the air layers of the entire pixel array 110 to the vulnerable point, pressures corresponding to the volume of each of the first to third air layers 240a to 240c may be applied to the vulnerable point. In this way, the pressures applied to the vulnerable point can be dispersed and thus the collapse (or popping) of the air grid structure at the vulnerable point can be effectively prevented.

The color filter 300 may be formed over the substrate region 270 while simultaneously being disposed between the stacked air grids 210-1. The color filter 300 may selectively transmit a light signal (e.g., red light, green light, blue light, magenta light, yellow light, cyan light, or the like) having a specific wavelength. In accordance with an embodiment of the disclosed technology, when the unit pixel P5 corresponds to a depth pixel, the color filter 300 may be omitted or may be replaced with an infrared (IR) filter.

The over-coating layer 310 may be disposed over the color filter 300 and the stacked air grid 210-1, and may prevent the diffuse reflection of light received from the outside, thereby suppressing flare characteristics. In some implementations, the over-coating layer 310 may compensate for a step difference between the color filter 300 and the stacked air grid 210-1, so that the over-coating layer 310 may allow the microlens 320 to have a constant height.

The microlens 320 may be formed over the over-coating layer 310, and may increase light gathering power of incident light, resulting in increased light reception (Rx) efficiency of the photodiode 275.

Although each of the metal layer 230, the first to third air layers 240a to 240c, and the isolation layers 262 and 264 are shown in FIG. 3 to have a constant width, other implementations are also possible. For example, the widths of the respective layers 230 to 240c may gradually decrease in the direction from the metal layer 230 to the air layer 240c. The decreasing ratio of the widths of the respective layers 230 to 240c can be constant or varied.

Figure 4:
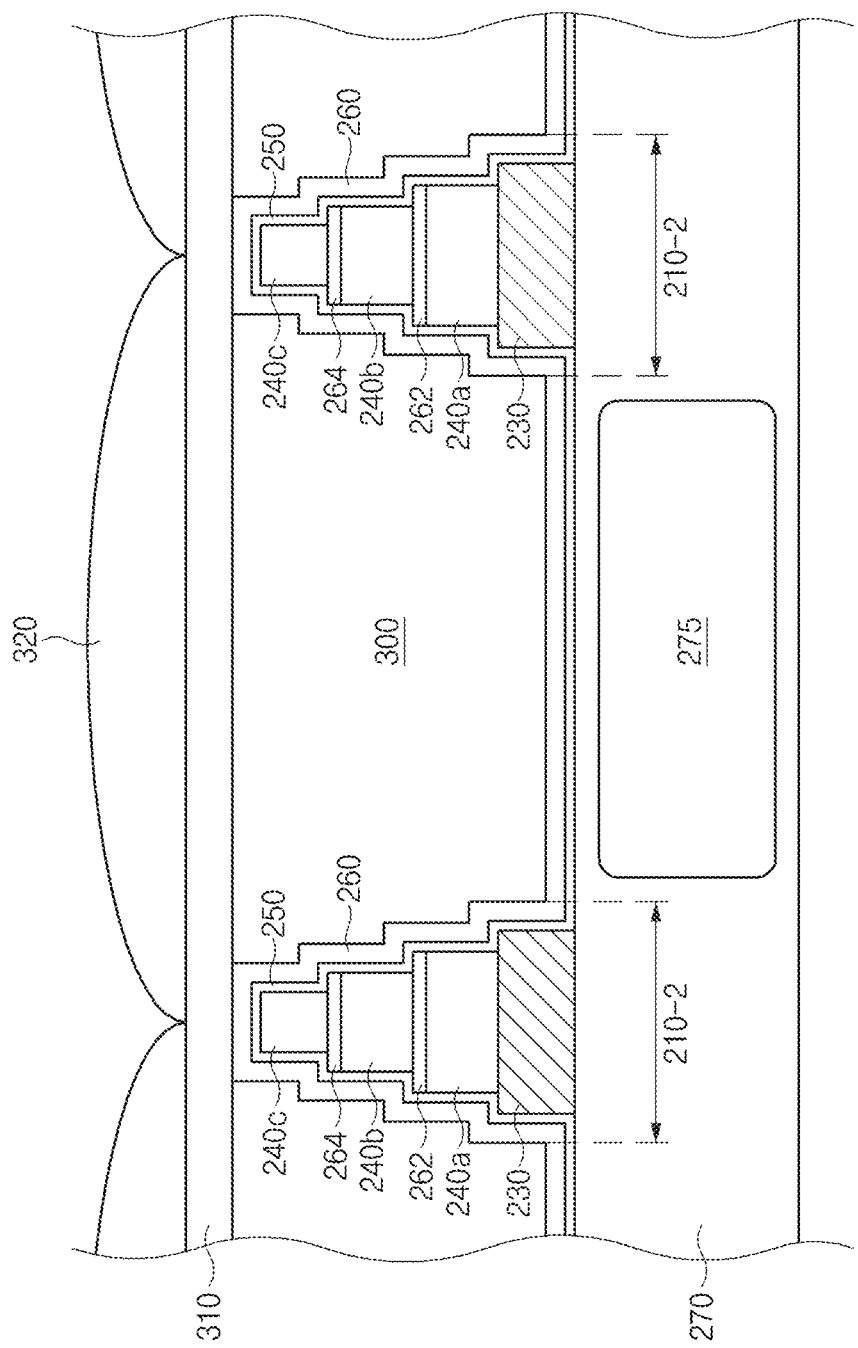
FIG. 4 is a cross-sectional view illustrating another example of a pixel array taken along a first cutting line or a second cutting line shown in FIG. 2 based on an implementation of the disclosed technology.

FIG. 4 is a cross-sectional view illustrating another example of the pixel array 110 taken along the first cutting line A-A' or the second cutting line B-B' shown in FIG. 2 according to some implementations of the disclosed technology. The stacked air grid 210-2 as part of the air grid structure 210 as shown in FIG. 4 has layers whose widths decrease along a direction from the metal layer 230 to the air layer 240c. The stacked air grid 210-2, however, also provides increased light reception (Rx) efficiency and reduction in the possibility of structure collapse, as same as that in shown in FIG. 3.

Referring to FIG. 4, two stacked air grids 210-2 may be disposed over the cross-sectional view taken along the first cutting line A-A' or the second cutting line B-B' while being spaced apart from each other by a specific distance corresponding to a width of the pixel P5. As previously stated above, the color filter of the pixel P5 may be disposed between the two stacked air grids 210-2. The height of a top surface of the color filter may be higher than the height of the stacked air grid 210-2, may be lower than the height of the stacked air grid 210-2, or may be identical to the height of the stacked air grid 210-2.

The cross-sectional view of the pixel array 110 may include a substrate 270, a photodiode 275, at least one stacked air grid 210-2, a color filter 300, an over-coating layer 310, and a microlens 320. The photodiode 275 is shown as an example of the photoelectric conversion element and can be configured with any other element which can generate photocharges in response to light. The substrate 270, the photodiode 275, the color filter 300, the over-coating layer 310, and the microlens 320 as shown in FIG.

4 may be substantially identical to the substrate 270, the photodiode 275, the color filter 300, the over-coating layer 310, and the microlens 320 as shown in FIG. 3, and thus the detailed descriptions thereon will be omitted for brevity.

The stacked air grid 210-2 may include the metal layer 230, the first to third air layers 240a, 240b, and 240c, the first capping film 250, the second capping film 260, and the isolation layers 262 and 264. Dimensions of the layers included in the stacked air grid 210-2 as shown in FIG. 4 are examples only. Thus, a relatively width, a relative height, and a relative thickness of each of constituent elements contained in the stacked air grid 210-2 are not limited to those of FIG. 4, and can be changed as needed.

The above-mentioned components of the stacked air grid 210-2 may be substantially identical in structure to those of the stacked air grid 210-1 shown in FIG. 3 and the descriptions on the identical characteristics of the air gird structure 210-2 to those of the air grid 201-1 will be omitted below. Thus, in the below, different characteristics of the stacked air grid 210-2 will be described in more detail.

The metal layer 230 and the first to third air layers 240a, 240b and 240c, which are contained in the stacked air grid 210-2, may be different in thickness. As shown in FIG. 4, the widths of the metal layer 230, the first air layer 240a, the second air layer 240b, and the third air layer 240c may gradually decrease in the direction from the metal layer 230 to the air layer 240c. Therefore, the stacked air grid 210-2 may be formed in a pyramid shape.

As the width of the stacked air grid 210-2 gradually decreases in an upward direction thereof, the amount of light to be reflected outside (e.g., toward the microlens) by the upper part (e.g., the upper part of the air layer 240c) of the stacked air grid 210-2 can be reduced, and the amount of light incident toward the stacked air grid 210-2 can be effectively guided into the corresponding unit pixel. As a result, light reception (Rx) efficiency of the unit pixel can be increased, which results in the improvements in quantum efficiency (QE).

In some implementations, the isolation layer 262 may be identical in width to the air layer 240a disposed below the isolation layer 262, and the isolation layer 264 may be identical in width to the air layer 240b disposed below the isolation layer 264. As a result, each of the isolation layers 262 and 264 contacts the first capping film 250 at not only some parts of the side surface of each of the isolation layers 262 and 264, but also some parts of the top surface of each of the isolation layers 262 and 264. Thus, a contact region between the first capping film 250 and each of the isolation layers 262 and 264 can increase in size, such that the stacked air grid 210-2 can be more stably and firmly maintained in shape.

In addition, the volume of each of the second and third air layers 240b and 240c gradually decrease, and pressures applied to a vulnerable point that may exist in a specific portion of the first and second capping films 250 and 260 can reduce as well. Thus, it is possible to minimize a risk that the stacked air grid 210-2 collapses at the vulnerable point.

Differences in width among the metal layer 230, the first air layer 240a, the second air layer 240b, and the third air layer 240c may be experimentally determined in consideration of not only information needed to maintain the shape of the first to third air layers 240a to 240c but also increased light reception (Rx) efficiency.

Figure 5:
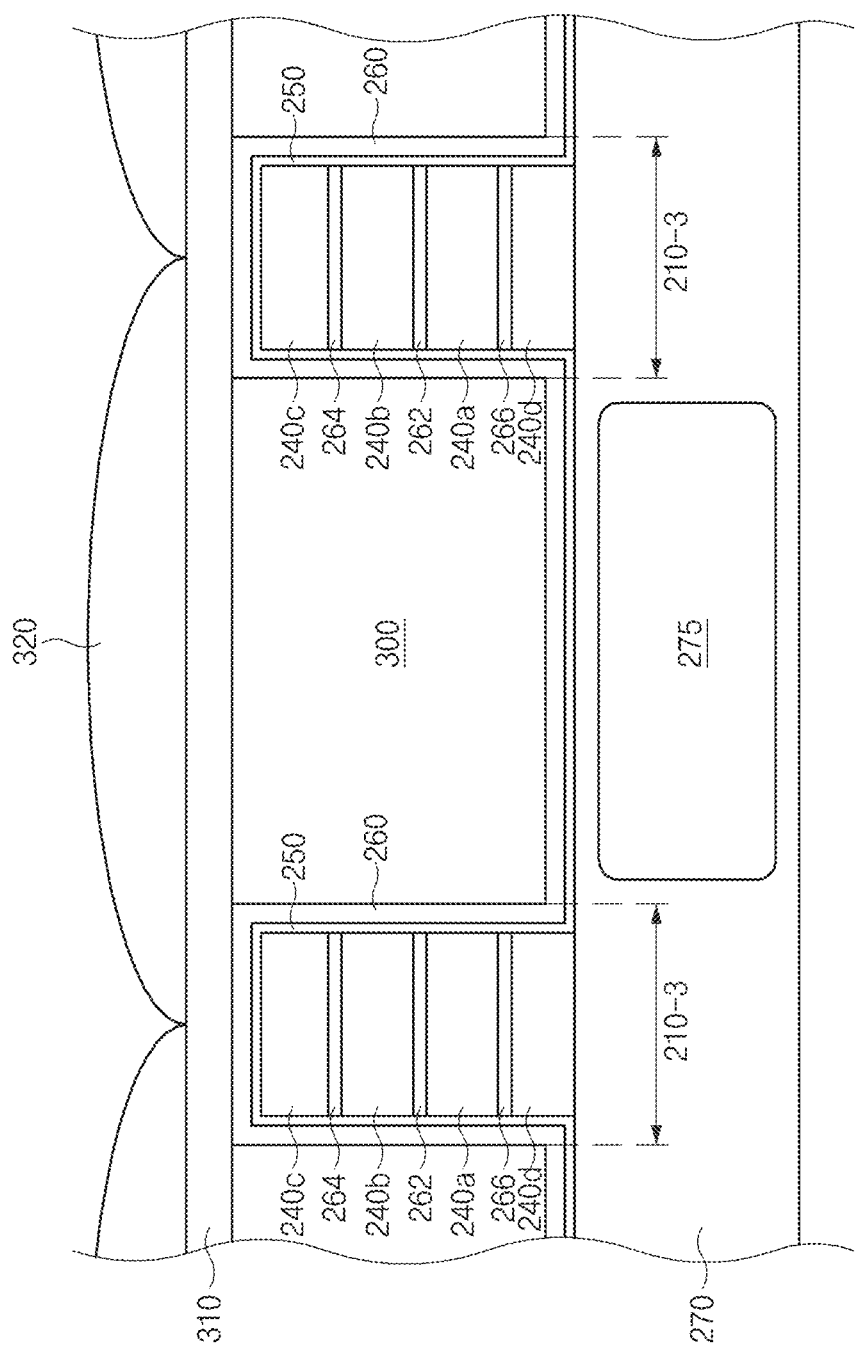
FIG. 5 is a cross-sectional view illustrating another example of a pixel array taken along a first cutting line or a second cutting line shown in FIG. 2 based on an implementation of the disclosed technology.

FIG. 5 is a cross-sectional view illustrating another example of the pixel array 110 taken along the first cutting line A-A' or the second cutting line B-B' shown in FIG. 2 based on some implementations of the disclosed technology.

Referring to FIG. 5, two air grid structures 210-3 may be disposed to be spaced apart from each other by a specific distance corresponding to a width of the pixel P5. As previously stated above, the color filter of the pixel P5 may be disposed between the two stacked air grids 210-3. The height of a top surface of the color filter may be higher than the height of the stacked air grid 210-3, may be lower than the height of the stacked air grid 210-3, or may be identical to the height of the stacked air grid 210-3.

The cross-sectional view of the pixel array 110 may include a substrate 270, a photodiode 275, at least one stacked air grid 210-3, a color filter 300, an over-coating layer 310, and a microlens 320. The photodiode 275 is shown as an example of the photoelectric conversion element and can be configured with any other element which can generate photocharges in response to light. The substrate 270, the photodiode 275, the color filter 300, the over-coating layer 310, and the microlens 320 shown in FIG. 5 may be substantially identical in structure, function, and material to the substrate 270, the photodiode 275, the color filter 300, the over-coating layer 310, and the microlens 320 shown in FIG. 3, and thus the detailed description thereon will be omitted for brevity.

The stacked air grid 210-3 may include the first to fourth air layers 240a, 240b, 240c and 240d, the first capping film 250, the second capping film 260, and the isolation layers 262, 264 and 266. Dimensions of the layers included in the stacked air grid 210-2 as shown in FIG. 4 are examples only. Thus, a relatively width, a relative height, and a relative thickness of each of constituent elements contained in the stacked air grid 210-3 are not limited to those of FIG. 5, and can be changed as needed.

Unlike the implementation as shown in FIG. 3, the stacked air grid 210-3 may be formed without the metal layer 230. The first to third air layers 240a, 240b and 240c, the first capping film 250, the second capping film 260, and the isolation layers 262 and 264, which are contained in the stacked air grid 210-3 shown in FIG. 5, may be substantially identical in structure and material to those of the stacked air grid 210-1 shown in FIG. 3, and the descriptions on the identical characteristics of the air gird structure 210-3 to those of the stacked air grid 210-1 will be omitted for brevity.

While the stacked air grid 210-3 does not include the metal layer 230, the stacked air grid 210-3 may include the fourth air layer 240b and the isolation layer 266. The fourth air layer 240b may be disposed in the region where the metal layer 230 is disposed in the air gird structure 210-1. The isolation layer 266 may be configured to physically isolating the fourth air layer 240d from the first air layer 240a. Therefore, the stacked air grid 210-3 may include a stacked structure in which the first to fourth air layers 240a, 240b, 240c and 240d are stacked.

Each of the first to fourth air layers 240a to 240d may be filled with air having a relatively low refractive index (e.g., a refractive index of 1). In accordance with another embodiment, the first to fourth air layers 240a to 240d may be filled with different kinds of gas. For example, the first air layer 240a filled with first gas, the second air layer 240b filled with second gas, the third air layer 240c filled with third gas, and the fourth air layer 240d filled with fourth gas may be sequentially disposed over the substrate 270. In some implementations, the first gas, the second gas, the third gas, and the fourth gas may have different refractive indexes based on the relative positions of the first to fourth air layers 240a to 240d in the stacked air grid 210-3. For example, the first to fourth gases may have refractive indexes that increase as a distance between each of the first to fourth air layers 240a to 240d and the substrate becomes smaller. In some other examples, the first to fourth gases may have refractive indexes that decrease as a distance between each of the first to fourth air layers 240a to 240d and the substrate becomes smaller.

FIG. 5 shows that the first to fourth air layers 240a to 240d may have a same height. In some implementations, the heights of the first to fourth air layers 240a to 240d may be different from one another. For example, the first to fourth air layers 240a to 240d may have heights that gradually increase in a downward direction from the first air layer 240a to the fourth air layer 240d, or may have heights that gradually reduce in a downward direction from the first air layer 240a to the fourth air layer 240d.

Although FIG. 5 shows that the first to fourth air layers 240a to 240d and the isolation layers 262 and 264 are identical in width to each other, other implementations are also possible. For example, the respective layers 240d, 266, 240a, 262, 240b, 264, and 240c may have widths that gradually decrease in the direction from the lower air layer 240d to the upper air layer 240c. The decreasing ratio of the widths of the respective layers 230 to 240c can be constant or varied.

Figure 6:
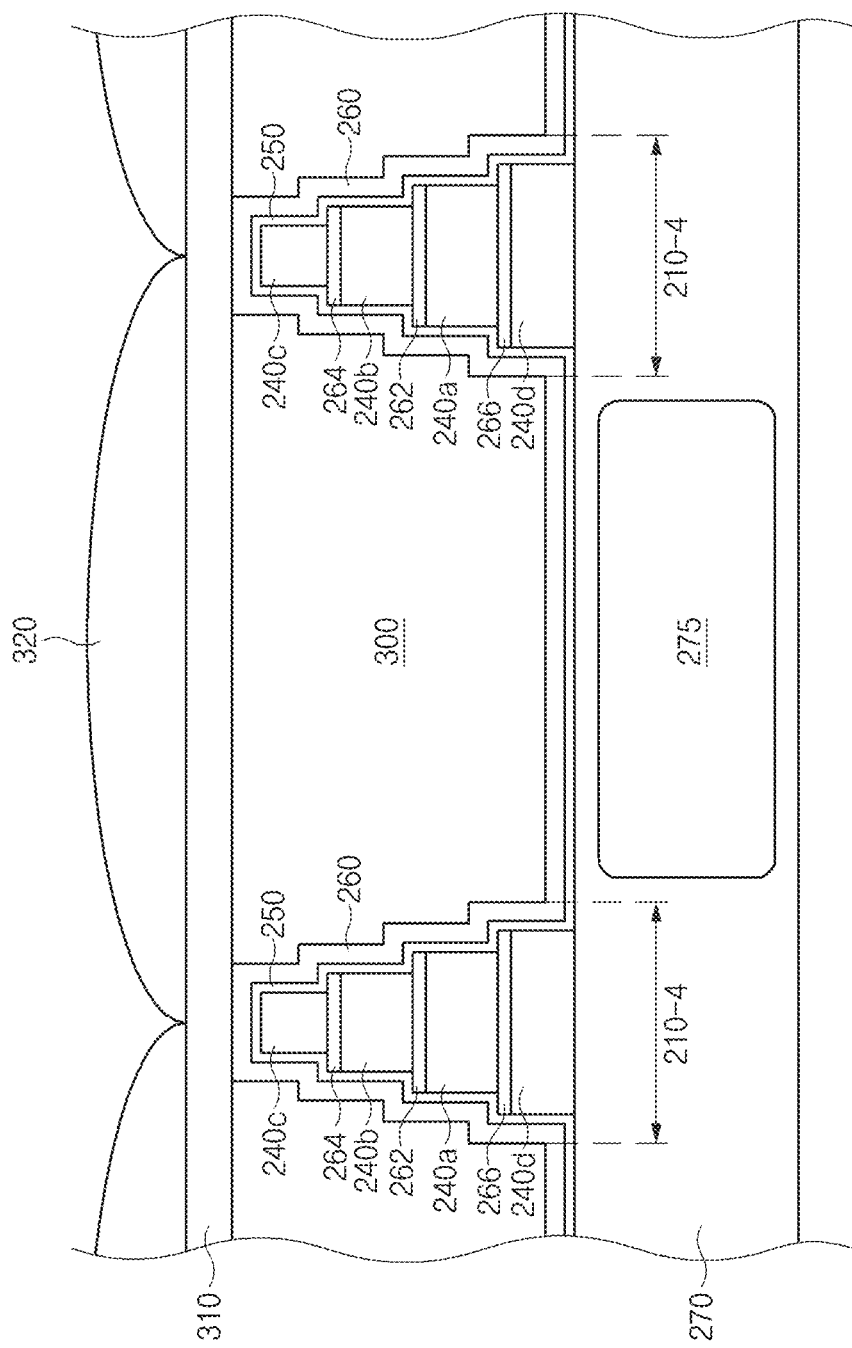
FIG. 6 is a cross-sectional view illustrating still another example of a pixel array taken along a first cutting line or a second cutting line shown in FIG. 2 based on an implementation of the disclosed technology.

FIG. 6 is a cross-sectional view illustrating still another example of the pixel array 110 taken along the first cutting line A-A' or the second cutting line B-B' shown in FIG. 2 according to some implementations of the disclosed technology.

Referring to FIG. 6, two air grid structures 210-4 may be disposed to be spaced apart from each other by a specific distance corresponding to a width of the pixel P5. As previously stated above, the color filter of the pixel P5 may be disposed between the two stacked air grids 210-4. The height of a top surface of the color filter may be higher than the height of the stacked air grid 210-4, may be lower than the height of the stacked air grid 210-4, or may be identical to the height of the stacked air grid 210-4.

The cross-sectional view of the pixel array 110 may include a substrate 270, a photodiode 275, at least one stacked air grid 210-4, a color filter 300, an over-coating layer 310, and a microlens 320. The photodiode 275 is shown as an example of the photoelectric conversion element and can be configured with any other element which can generate photocharges in response to light. The substrate 270, the photodiode 275, the color filter 300, the over-coating layer 310, and the microlens 320 shown in FIG. 6 may be substantially identical in structure, function, and material to the substrate 270, the photodiode 275, the color filter 300, the over-coating layer 310, and the microlens 320 shown in FIG. 3, and thus the detailed descriptions thereon will be omitted for brevity.

The stacked air grid 210-4 may include the first to fourth air layers 240a, 240b, 240c and 240d, the first capping film 250, the second capping film 260, and the isolation layers 262, 264 and 266. Dimensions of the layers included in the stacked air grid 210-2 as shown in FIG. 4 are examples only. Thus, a relatively width, a relative height, and a relative thickness of each of constituent elements contained in the stacked air grid 210-4 are not limited to those of FIG. 6, and can be changed as needed.

Unlike the implementation as shown in FIG. 5, the stacked air grid 210-4 may be formed without the metal layer 230. The first to fourth air layers 240a, 240b, 240c and 240d, the first capping film 250, the second capping film 260, and the isolation layers 262, 264 and 266, which are contained in the stacked air grid 210-4 shown in FIG. 6, may be substantially identical in structure and material to those of the air grid structures shown in FIGS. 3 to 5, and the descriptions on the identical characteristics of the air gird structure 210-4 to those of the stacked air grid 210-1 to 210-3 will herein be omitted for brevity.

While the stacked air grid 210-4 does not include the metal layer 230, the stacked air grid 210-4 may include the fourth air layer 240d and the isolation layer 266. The fourth air layer 240d may be disposed in the region where the metal layer 230 is disposed in the air gird structure 210-3. The isolation layer 266 may be configured to physically isolate the fourth air layer 240d from the first air layer 240a. Therefore, the stacked air grid 210-4 may include a stacked structure in which the first to fourth air layers 240a, 240b, 240c and 240d are stacked.

Each of the first to fourth air layers 240a to 240d may be filled with air having a relatively low refractive index (e.g., a refractive index of 1). In accordance with another embodiment, the first to fourth air layers 240a to 240d may be filled with different kinds of gas. For example, the first air layer 240a filled with first gas, the second air layer 240b filled with second gas, the third air layer 240c filled with third gas, and the fourth air layer 240d filled with fourth gas may be sequentially disposed over the substrate 270. In some implementations, the first gas, the second gas, the third gas, and the fourth gas may have different refractive indexes based on the relative positions of the first to fourth air layers 240a to 240d in the stacked air grid 210-4. For example, the first to fourth gases may have refractive indexes that increase as a distance between each of the first to fourth air layers 240a to 240d and the substrate becomes smaller. In another example, the first to fourth gases may have refractive indexes that decrease as a distance between each of the first to fourth air layers 240a to 240d and the substrate becomes smaller.

FIG. 6 shows that the first to fourth air layers 240a to 240d may have a same height. In some implementations, the heights of the first to fourth air layers 240a to 240d may be different from one another. For example, the first to fourth air layers 240a to 240d may have heights that gradually increase in a downward direction from the first air layer 240a to the fourth air layer 240d, or may have heights that gradually reduce in a downward direction from the first air layer 240a to the fourth air layer 240d.

FIGS. 7A to 7F are cross-sectional views illustrating processes for forming the air grid structure shown in FIG. 3 according to some implementations of the disclosed technology.

Referring to FIGS. 7A to 7F, a method for forming the stacked air grid 210-1 including the metal layer 230 shown in FIG. 3 will hereinafter be described. The processes for forming the stacked air grid 210-1 as shown in FIGS. 7A to 7F can be applied to form the stacked air grid 210-2 shown in FIG. 4. With regard to the pyramid shape of the stacked air grid 210-2 shown in FIG. 4, the additional process needs to be performed to make the stacked air grid 210-2 shown in FIG. 4 have the pyramid shape and such additional process to will be described later with reference to the attached drawings.

The cross-sectional views shown in FIGS. 7A to 7F may respectively correspond to cross-sectional views taken along the first cutting line A-A' or the second cutting line B-B' shown in FIG. 2.

Figure 7A:
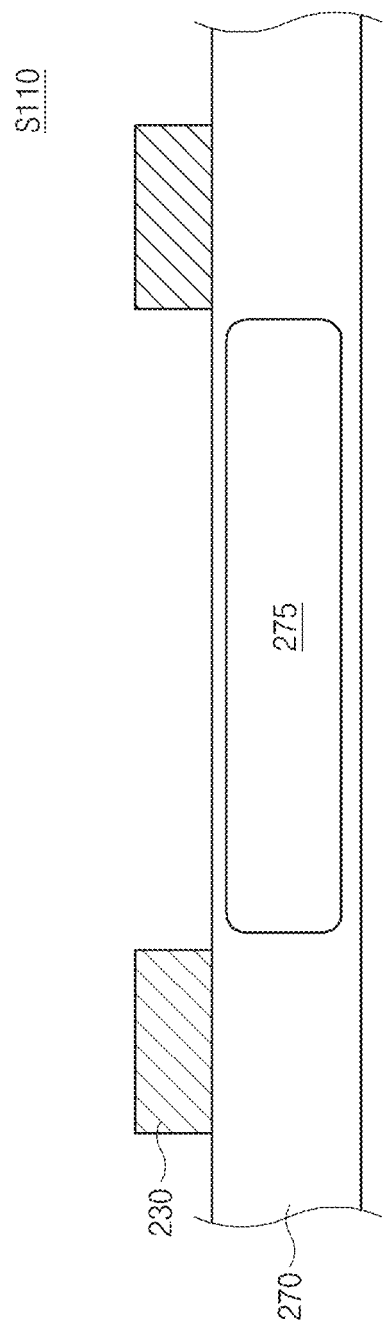
FIGS. 7A to 7F are cross-sectional views illustrating example processes for forming an air grid structure shown in FIG. 3 based on an implementation of the disclosed technology.

In step S110 shown in FIG. 7A, the metal layer 230 may be deposited over the substrate 270 in which the photodiode 275 is formed, resulting in formation of the metal layer 230. The height of the metal layer 230 may correspond to the height of the metal layer 230 of the stacked air grid 210-1. For example, the substrate 270 may be a P-type or N-type bulk substrate, may be a P-type bulk substrate in which a P-type or N-type epitaxial layer is grown, or may be an N-type bulk substrate in which a P-type or N-type epitaxial layer is grown.

After completion of formation of the metal layer 230, a first mask pattern (not shown) defining the stacked air grid 210-1 may be disposed over the metal layer 230, and the metal layer 230 may be etched using the first mask pattern (not shown) as an etch mask, such that the metal layer 230 corresponding to the stacked air grid 210-1 may be formed. In some implementations, the etch height of the metal layer 230 may be predetermined by the height of the metal layer 230 contained in the stacked air grid 210-1. The first mask pattern (not shown) and additional mask patterns that are described later may include a photoresist pattern.

After etching of the metal layer 230 is completed, the first mask pattern (not shown) may be removed.

Figure 7B:
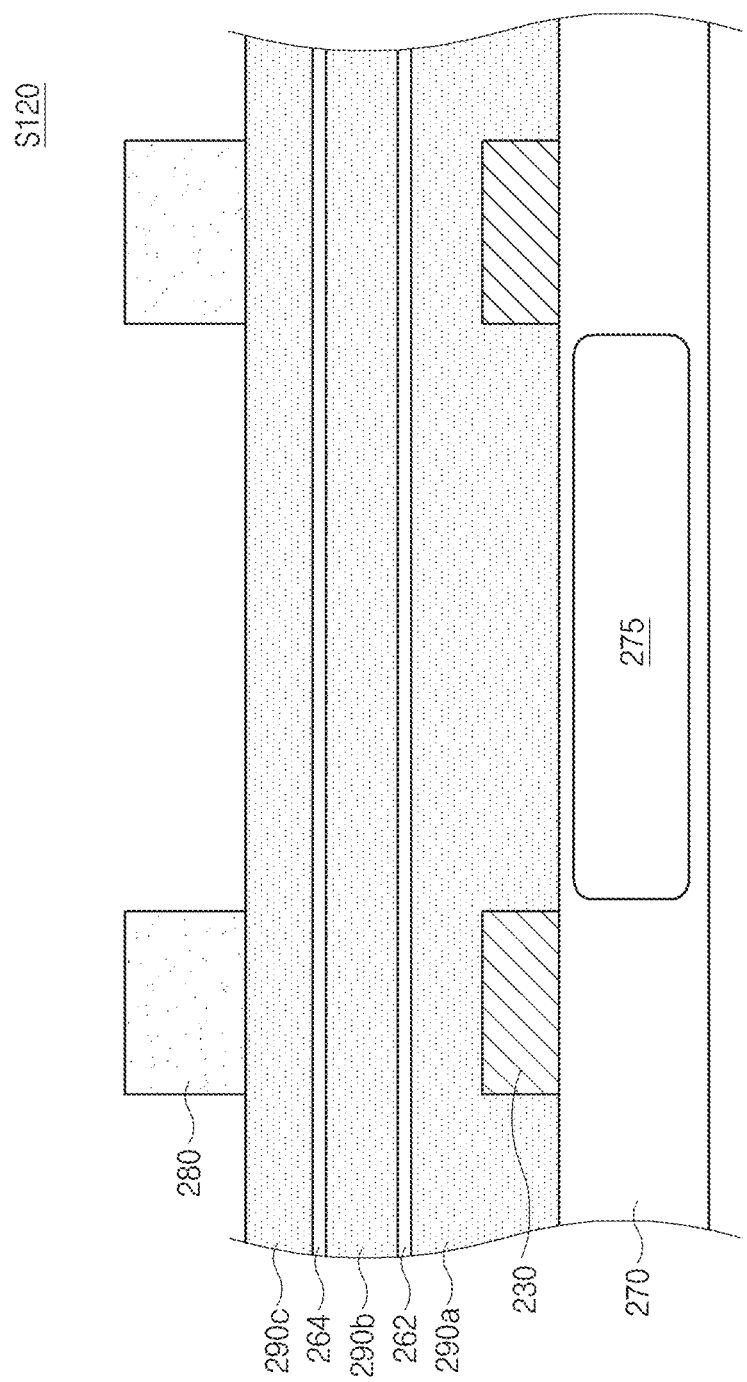

In step S120 shown in FIG. 7B, the sacrificial film 290a, the isolation layer 262, the sacrificial film 290b, the isolation layer 264, and the sacrificial film 290c may be formed over the entirety of the metal layer 230 and the substrate 270 through a deposition process. Each of the sacrificial films 290a to 290c may include a carbon-containing Spin On Carbon (SOC) film.

Thereafter, a second mask pattern 280 formed to define the stacked air grid 210-1 may be disposed over the sacrificial film 290c.

The second mask pattern 280 may be formed to extend perpendicular to the sacrificial film 290c, such that the second mask pattern 290c may be arranged perpendicular to the cross-sectional view of the sacrificial film 290c. In accordance with another embodiment, differently from FIG. 7B, the second mask pattern 280 shown in FIG. 7C may not extend perpendicular to the sacrificial film 290c, and may extend while being tilted at a constant slope in a direction perpendicular to the sacrificial film 290c. In this case, the cross-sectional view of the second mask pattern 280 may be formed in a trapezoidal shape. The trapezoidal second mask pattern 280 may be formed by controlling a mask photoresist profile.

Figure 7C:
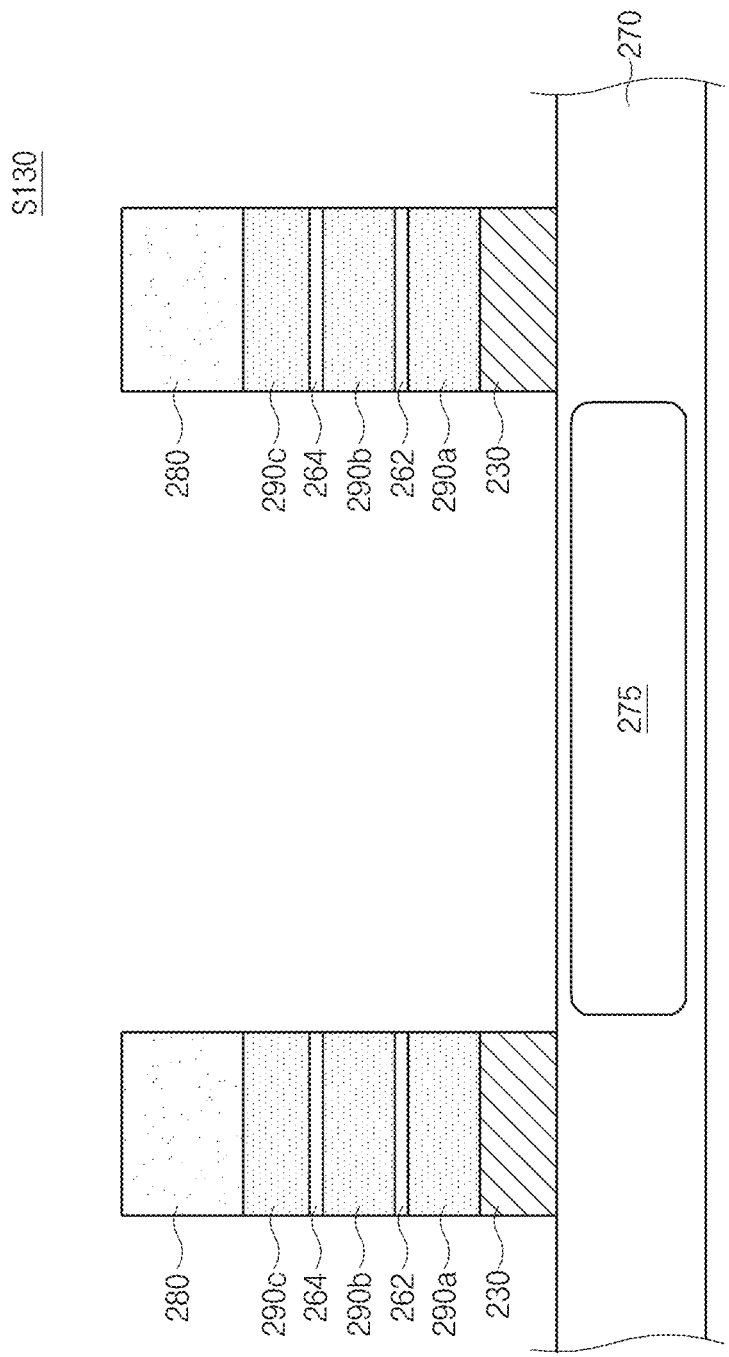

In step S130 of FIG. 7C, the sacrificial films 290a to 290c, the isolation layers 262 and 264, and the metal layer 230 may be etched using the second mask pattern 280 as an etch mask, such that the sacrificial films 290a to 290c, the isolation layers 262 and 264, and the metal layer 230 disposed in the region (e.g., the unit pixel region) from which the stacked air grid 210-1 is excluded may be removed. Thereafter, the second mask pattern 280 may be removed. After the completion of the step S130, the sacrificial films 290a to 290c that respectively correspond in shape to the first to third air layers 240a to 240c included in the stacked air grid 210-1 may be completely formed.

Differently from FIG. 7B, if the second mask pattern 280 extends while being tilted at a constant slope in a direction perpendicular to the sacrificial film 290c, the sacrificial films 290a to 290c, the isolation layers 262 and 264, and the metal layer 230, each of which has been etched, may be gradually reduced in width in an upward direction according to a slope corresponding to a predetermined slope of the second mask pattern 280.

A process for forming the stacked air grid 210-2 shown in FIG. 4 with the pyramid shape will hereinafter be described in detail. The etching process of S130 may be carried out several times. For example, the second mask pattern formed to define the air layer 240c may be disposed over the sacrificial film 290c. The second mask pattern formed to define the air layer 240c may be used as the etch mask. The etching process may proceed at the etch energy capable of etching only the sacrificial film 290c. Thereafter, the second mask pattern defining the air layer 240c may be removed, and the second mask pattern defining the air layer 240b may be disposed over the sacrificial film 290c. Subsequently, in a situation in which the second mask pattern defining the air layer 240b is used as the etch mask, the etching process may be performed at etch energy capable of etching only the isolation layer 264 and the sacrificial film 290b. Then, the second mask pattern defining the air layer 240b may be removed, and the second mask pattern defining the air layer 240a may be disposed over the sacrificial film 290c. Subsequently, in a situation in which the second mask pattern defining the air layer 240a is used as the etch mask, the etching process may be performed at etch energy capable of etching only the isolation layer 262 and the sacrificial film 290a. Thereafter, the second mask pattern defining the air layer 240a may be removed, and the second mask pattern defining the metal layer 230 may be disposed over the sacrificial film 290c. In a situation in which the second mask pattern defining the metal layer 230 is used as the etch mask, the etching process may be performed at etch energy capable of etching only the metal layer 230. Subsequently, after the second mask pattern is removed, the sacrificial films 290a to 290c that correspond in shape to the first to third air layers 240a to 240c included in the stacked air grid 210-2 may be completely formed.

Figure 7D:
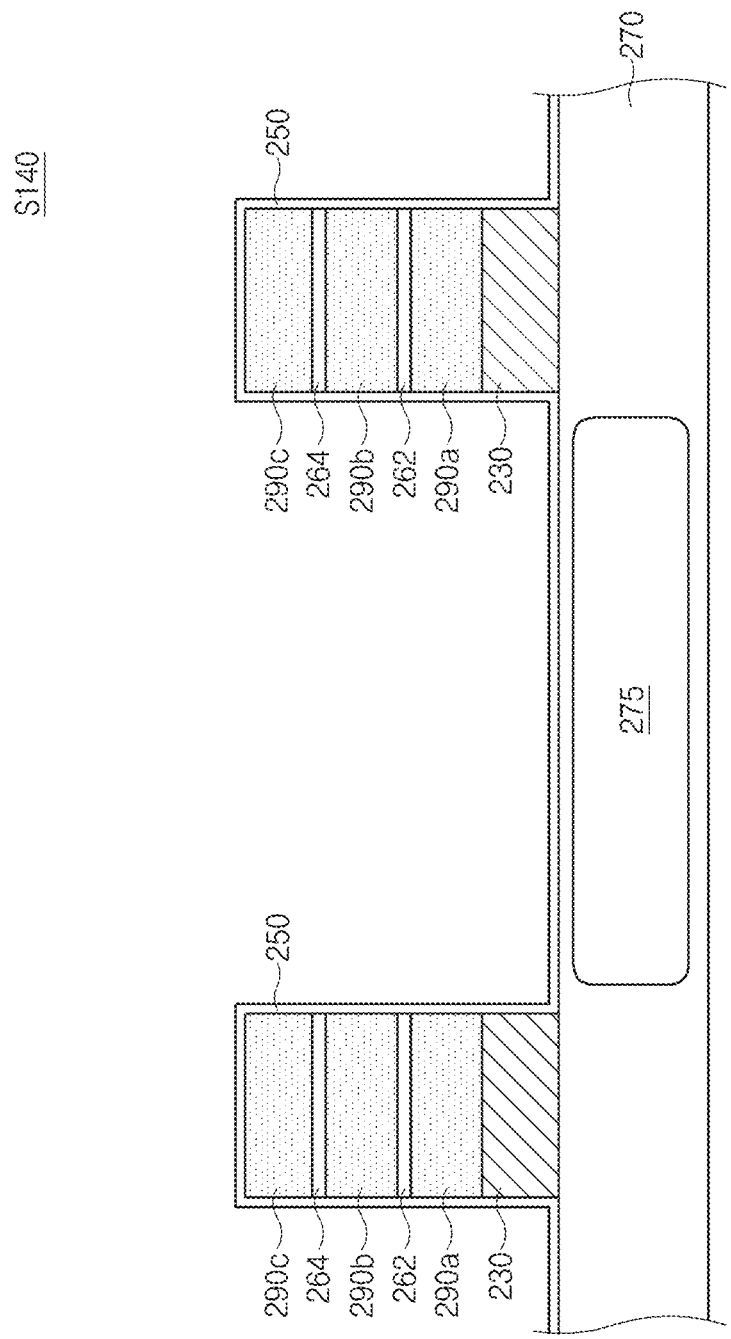

In step S140 of FIG. 7D, the first capping film 250 may be formed over the substrate 270, the sacrificial films 290a to 290c, the isolation layers 262 and 264, and the metal layer 230 through a deposition process. The first capping film 250 may include an oxide film, preferably, a ULTO film. In some implementations, the first capping film 250 may be formed to a predetermined thickness through which molecules formed by combining gas to be used in a subsequent plasma process with carbon of the sacrificial films 290a to 290c can be easily discharged outside. In some implementations, the first capping film 250 may be formed to a thickness of 300Å or less.

Figure 7E:
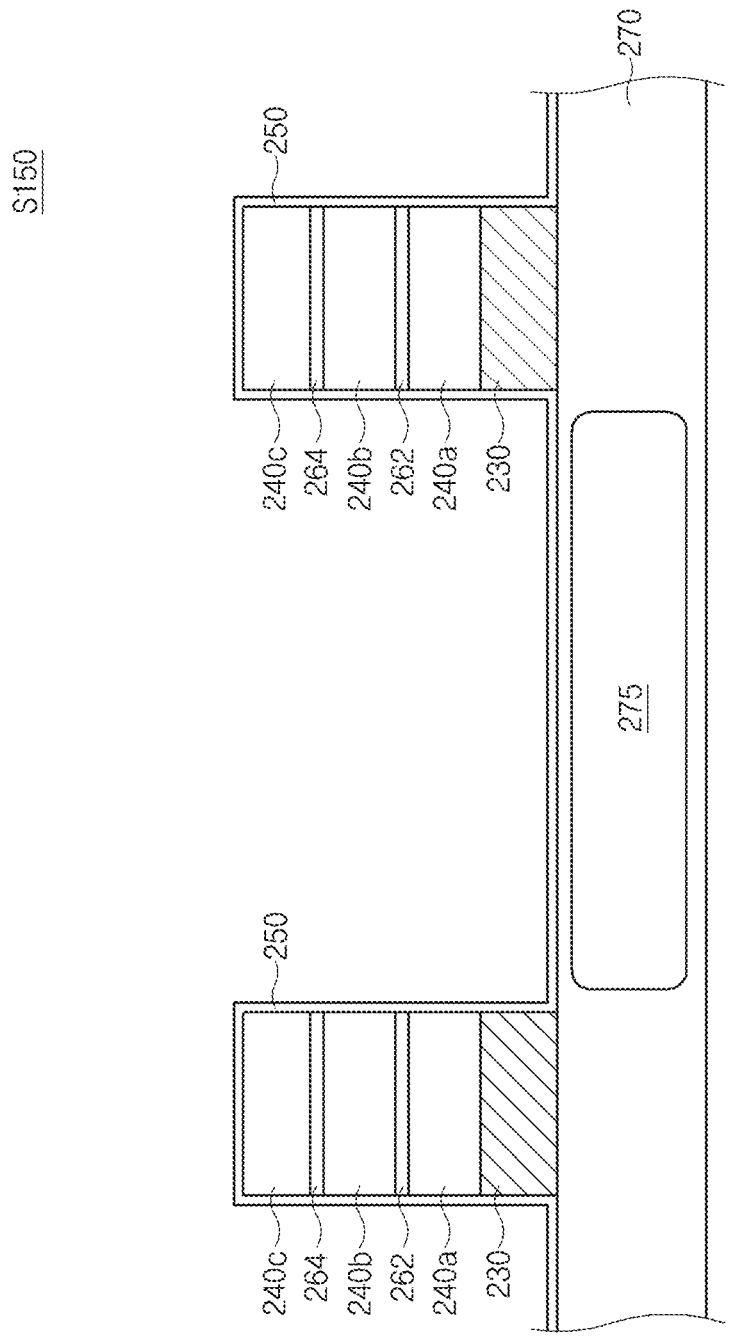

In step S150 of FIG. 7E, after formation of the first capping film 250, the plasma process may be carried out upon the resultant structure, such that the sacrificial films 290a to 290c may be removed and the air layers 240a to 240c may be formed at the position from which the sacrificial films 290a-290c are removed. In this case, the plasma process may be carried out using gas (e.g., $O_2$, $N_2$, $H_2$, CO, $CO_2$, or $CH_4$) including at least one of oxygen, nitrogen, and hydrogen. In this case, the above-mentioned processes will hereinafter be described using the $O_2$ plasma process as an example. If the $O_2$ plasma process is carried out upon the resultant structure, oxygen radicals (O*) may flow into the sacrificial films 290a-290c through the first capping film 250, and the oxygen radicals (O*) included in the sacrificial films 290a to 290c may be combined with carbons of the sacrificial films 290a to 290c, resulting in formation of CO or $CO_2$. The formed CO or $CO_2$ may be discharged outside through the first capping film 250. As a result, the sacrificial films 290a to 290c may be removed, and the air layers 240a to 240c may be formed at the position from which the sacrificial films 290a to 290c are removed.

In accordance with the present embodiment, in order to prevent collapse (or popping) of the first capping film 250 in a situation in which the sacrificial film 290c is removed, the plasma process may be carried out in a situation in which a support film (not shown) such as an oxide film is formed over the sacrificial film 290c.

Figure 7F:
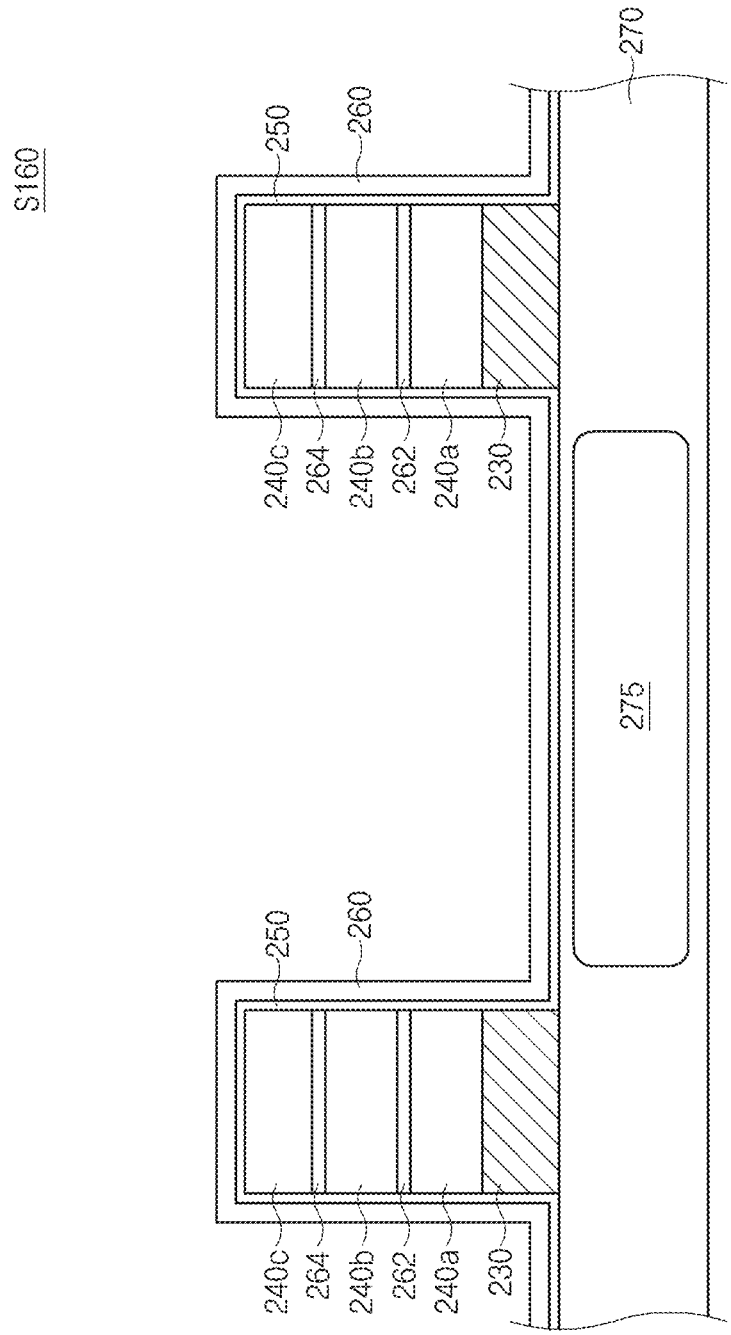

In step S160 of FIG. 7F, after completion of the plasma process, the second capping film 260 may be formed over the first capping film 250 through a deposition process. For example, the second capping film 260 may be formed of or include an insulation film that includes at least one of a silicon oxide nitride ($Si_xO_yN_z$, where each of 'x', 'y', and 'z' is a natural number) film, a silicon oxide ($Si_xO_y$, where each of 'x' and 'y' is a natural number) film, or a silicon nitride ($Si_xN_y$, where each of 'x' and 'y' is a natural number) film. The second capping film 260 may have a larger thickness than the first capping film 250. The second capping film 260 may be formed to a predetermined thickness through which the shape of the stacked air grid 210-1 can be stably maintained.

FIGS. 8A to 8E are cross-sectional views illustrating processes for forming the stacked air grid shown in FIG. 5 according to the disclosed technology.

Referring to FIGS. 8A to 8E, a process for forming the stacked air grid 210-3 from which the metal layer 230 of FIG. 5 is excluded will hereinafter be described. The processes for forming the stacked air grid 210-1 as shown in FIGS. 7A to 7F can be applied to form the stacked air grid 210-4 shown in FIG. 6. With regard to the pyramid shape of the stacked air grid 210-4 shown in FIG. 6, the additional process needs to be performed to make the stacked air grid 210-4 have the pyramid shape and such additional process will be described later with reference to the attached drawings.

The cross-sectional views shown in FIGS. 8A to 8E may respectively correspond to cross-sectional views taken along the first cutting line A-A' or the second cutting line B-B' shown in FIG. 2.

Figure 8A:
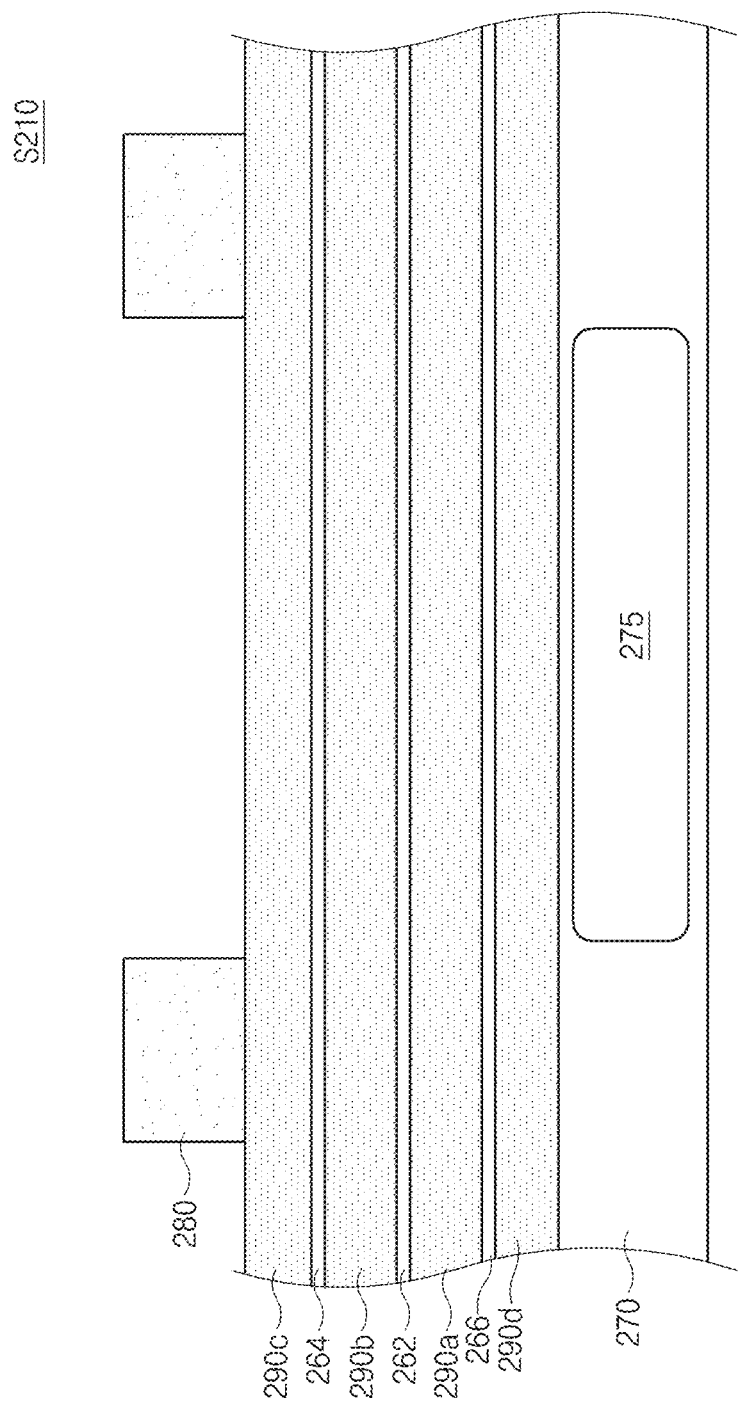

In step S210 shown in FIG. 8A, the sacrificial film 290d, the isolation layer 266, the sacrificial film 290a, the isolation layer 262, the sacrificial film 290b, the isolation layer 264, and the sacrificial film 290c may be sequentially formed over the entirety of the substrate 270 through a deposition process. Each of the sacrificial films 290a-290d may include a carbon-containing Spin On Carbon (SOC) film.

Thereafter, a second mask pattern 280 formed to define the stacked air grid 210-3 may be disposed over the sacrificial film 290c.

The second mask pattern 280 may be formed to extend perpendicular to the sacrificial film 290c, such that the second mask pattern 290c may be arranged perpendicular to the cross-sectional view of the sacrificial film 290c. In accordance with another embodiment, differently from FIG. 8A, the second mask pattern 280 may not extend perpendicular to the sacrificial film 290c, and may extend while being tilted at a constant slope in a direction perpendicular to the sacrificial film 290c. In this case, the cross-sectional view of the second mask pattern 280 may be formed in a trapezoidal shape. The trapezoidal second mask pattern 280 may be formed by controlling a mask photoresist profile.

Figure 8B:
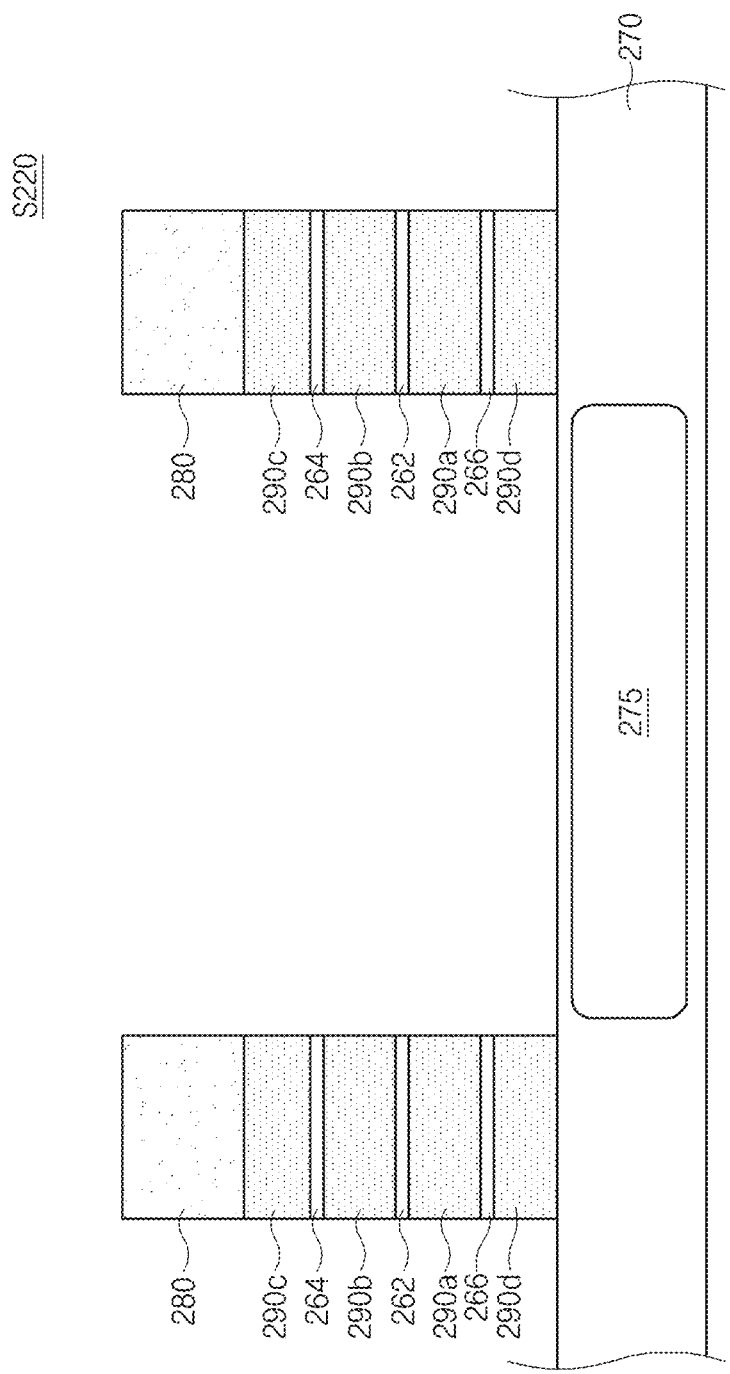

In step S220 of FIG. 8B, the sacrificial films 290a to 290d and the isolation layers 262, 264 and 266 may be etched using the second mask pattern 280 as an etch mask, such that the sacrificial films 290a to 290d and the isolation layers 262 and 264 disposed in the region (e.g., the unit pixel region) from which the stacked air grid 210-3 is excluded may be removed. Thereafter, the second mask pattern 280 may be removed. After completion of the step S220, the sacrificial films 290a to 290d that respectively correspond in shape to the first to fourth air layers 240a to 240d included in the stacked air grid 210-3 may be completely formed.

Differently from FIG. 8A, if the second mask pattern 280 extends while being tilted at a constant slope in a direction perpendicular to the sacrificial film 290c, the sacrificial films 290a to 290d, and the isolation layers 262, 264 and 266, each of which has been etched, may be gradually reduced in width in an upward direction according to a slope corresponding to a predetermined slope of the second mask pattern 280.

A process for forming the stacked air grid 210-4 shown in FIG. 6 with the pyramid shape will hereinafter be described in detail. The etching process of S220 may be carried out several times. For example, the second mask pattern formed to define the air layer 240c may be disposed over the sacrificial film 290c. The second mask pattern formed to define the air layer 240c may be used as the etch mask. The etching process may proceed at the etch energy capable of etching only the sacrificial film 290c. Thereafter, the second mask pattern defining the air layer 240c may be removed, and the second mask pattern defining the air layer 240b may be disposed over the sacrificial film 290c. Subsequently, in a situation in which the second mask pattern defining the air layer 240b is used as the etch mask, the etching process may be performed at etch energy capable of etching only the isolation layer 264 and the sacrificial film 290b. Then, the second mask pattern defining the air layer 240b may be removed, and the second mask pattern defining the air layer 240a may be disposed over the sacrificial film 290c. Subsequently, in a situation in which the second mask pattern defining the air layer 240a is used as the etch mask, the etching process may be performed at etch energy capable of etching only the isolation layer 262 and the sacrificial film 290a. Thereafter, the second mask pattern defining the air layer 240a may be removed, and the second mask pattern defining the air layer 240d may be disposed over the sacrificial film 290c. In a situation in which the second mask pattern defining the air layer 240d is used as the etch mask, the etching process may be performed at etch energy capable of etching only the isolation layer 266 and the sacrificial film 290d. Subsequently, after the second mask pattern is removed, the sacrificial films 290a to 290d that correspond in shape to the first to fourth air layers 240a to 240d included in the stacked air grid 210-4 may be completely formed.

In step S230 of FIG. 8C, the first capping film 250 may be formed over the sacrificial films 290a to 290d and the isolation layers 262, 264 and 266 through a deposition process. The first capping film 250 may include an oxide film, preferably, a ULTO film. In some implementations, the first capping film 250 may be formed to a predetermined thickness through which molecules formed by combining gas to be used in a subsequent plasma process with carbon of the sacrificial films 290a to 290d can be easily discharged outside. In some implementations, the first capping film 250 may be formed to a thickness of 300 Å or less.

Figure 8D:
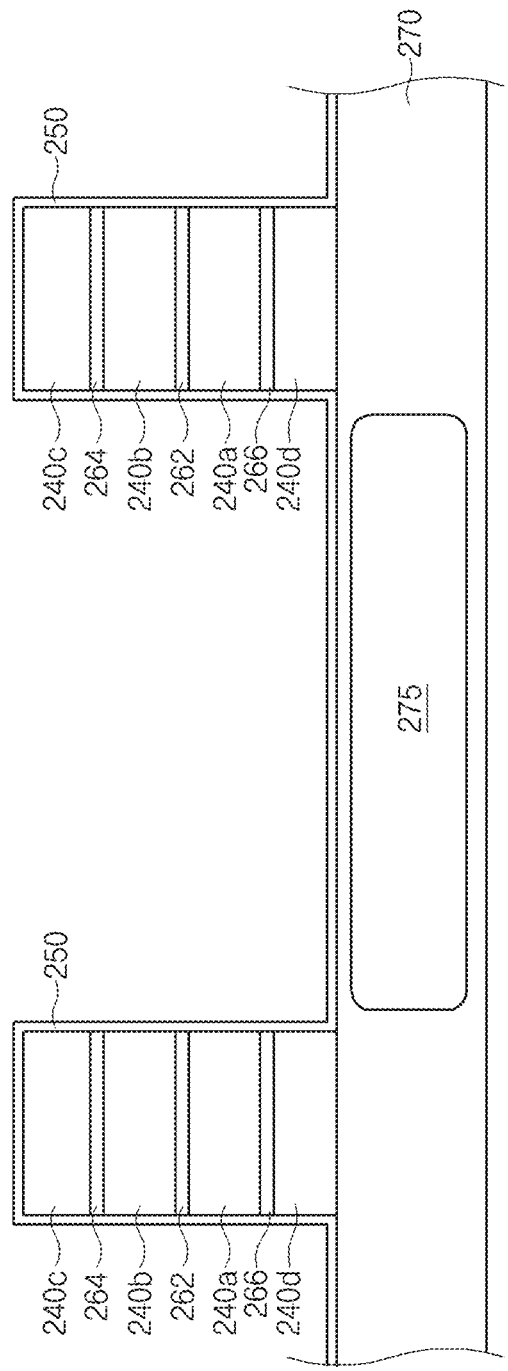

In step S240 of FIG. 8D, after formation of the first capping film 250, the plasma process may be carried out upon the resultant structure, such that the sacrificial films 290a to 290d may be removed and the first to fourth air layers 240a to 240d may be formed at the position from which the sacrificial films 290a-290d are removed. In this case, the plasma process may be carried out using gas (e.g., $O_2$, $N_2$, $H_2$, $CO$, $CO_2$, or $CH_4$) including at least one of oxygen, nitrogen, and hydrogen. In this case, the above-mentioned processes will hereinafter be described using the $O_2$ plasma process as an example. If the $O_2$ plasma process is carried out upon the resultant structure, oxygen radicals (O*) may flow into the sacrificial films 290a-290d through the first capping film 250, and the oxygen radicals (O*)

included in the sacrificial films 290a to 290d may be combined with carbons of the sacrificial films 290a to 290d, resulting in formation of CO or $CO_2$. The formed CO or $CO_2$ may be discharged outside through the first capping film 250. As a result, the sacrificial films 290a to 290d may be removed, and the air layers 240a to 240d may be formed at the position from which the sacrificial films 290a to 290d are removed.

In accordance with the present embodiment, in order to prevent collapse (or popping) of the first capping film 250 in a situation in which the sacrificial film 290c is removed, the plasma process may be carried out in a situation in which a support film (not shown) such as an oxide film is formed over the sacrificial film 290c.

Figure 8E:
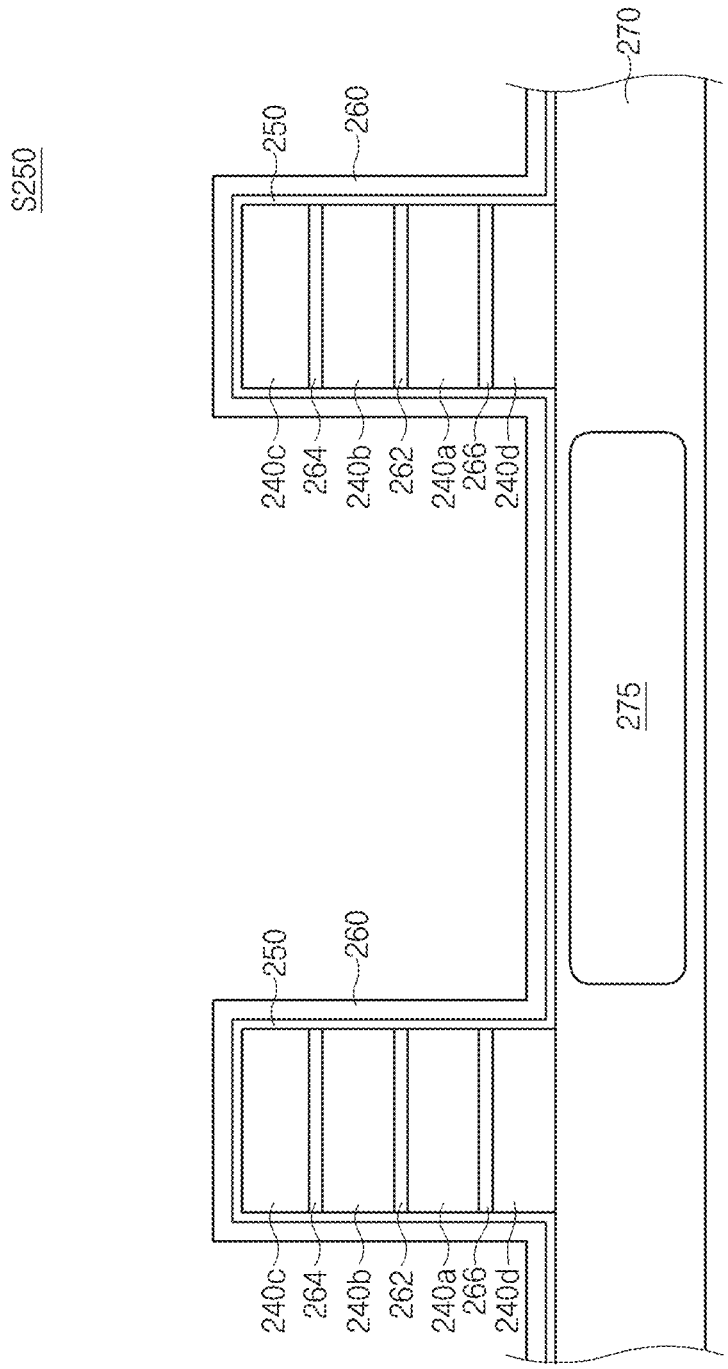

In step S250 of FIG. 8E, after completion of the plasma process, the second capping film 260 may be formed over the first capping film 250 through a deposition process. For example, the second capping film 260 may be formed of or include an insulation film that includes at least one of a silicon oxide nitride ($Si_xO_yN_z$, where each of 'x', 'y', and 'z' is a natural number) film, a silicon oxide ($Si_xO_y$, where each of 'x' and 'y' is a natural number) film, or a silicon nitride ($Si_xN_y$, where each of 'x' and 'y' is a natural number) film. The second capping film 260 may have a larger thickness than the first capping film 250. The second capping film 260 may be formed to a predetermined thickness through which the shape of the stacked air grid 210-3 can be stably maintained.

As is apparent from the above description, the image sensor according to the embodiments of the disclosed technology may distribute pressure applied to a vulnerable point of the air grid structure, such that the image sensor can effectively prevent collapse (or popping) of the air grid at the vulnerable point of the air grid.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. The above embodiments are therefore to be construed in all aspects as illustrative and not restrictive. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
a substrate including a photoelectric conversion element that produces an electrical signal in response to light incident to the photoelectric conversion element;
an air grid structure including a plurality of air layers that are stacked over the substrate along a direction perpendicular to a surface of the substrate and physically isolated from one another; and
a color filter disposed at one side of the air grid structure and above the substrate,
wherein the air grid structure further includes:
an isolation layer disposed between two adjacent air layers among the plurality of air layers; and
a first capping film formed to surround the plurality of air layers and the isolation layer, and
wherein the isolation layer has a width which is the same as a width of an upper surface of the air layer disposed below the isolation layer.

2. The image sensing device according to claim 1, further comprising an additional air grid structure coupled to the air grid structure and the air grid structure and the additional air grid structure are provided in a mesh shape.

3. The image sensing device according to claim 1, wherein:
a refractive index of the first capping film is higher than a refractive index of air included in the plurality of air layers and is less than a refractive index of the color filter contacting the air grid structure.

4. The image sensing device according to claim 1, wherein the air grid structure further includes:
a second capping film formed to surround the first capping film and having a thickness greater than that of the first capping film.

5. The image sensing device according to claim 4, wherein the first capping film and the second capping film are disposed below the color filter contacting the air grid structure.

6. The image sensing device according to claim 1, wherein the plurality of air layers includes a first air layer and a second air layer disposed over the first air layer and having a smaller width than that of the first air layer.

7. The image sensing device according to claim 1, wherein the air grid structure further includes:
a metal layer including metal and disposed below the plurality of air layers.

8. The image sensing device according to claim 7, wherein the metal includes tungsten (W).

9. The image sensing device according to claim 1, wherein the plurality of air layers has a width that gradually increases as being closer to the substrate.

10. An image sensing device comprising:
a substrate including photoelectric conversion elements, each configured to produce an electrical signal in response to light incident to a corresponding photoelectric conversion element;
color filters disposed over the photoelectric conversion elements, respectively, and arranged in a matrix shape including rows and columns; and
air grid structures disposed between any two adjacent color filters, each air grid structure configured to include air layers that are physically isolated from one another,
wherein the each air grid structure further includes:
an isolation layer disposed between two adjacent air layers and configured to physically isolate two adjacent air layers from each other; and
a first capping film disposed to surround the air layers and the isolation layer, and
wherein the isolation layer has a width which is the same as a width of an upper surface of the air layer disposed below the isolation layer.

11. The image sensing device according to claim 10, wherein the each air grid structure further includes:

a second capping film disposed to surround the first capping film and configured to have a thickness greater than that of the first capping film.

12. The image sensing device according to claim 11, wherein:

a refractive index of the first capping film is higher than a refractive index of air included in the air layers and is less than a refractive index of the color filter contacting the air grid structure.

13. The image sensing device according to claim 12, wherein the first capping film and the second capping film are disposed below the color filters contacting the air grid structures.

14. The image sensing device according to claim 10, wherein the air layers included in each of the air grid structures includes a first air layer and a second air layer disposed over the first air layer and having a smaller width than that of the first air layer.

15. The image sensing device according to claim 10, wherein the each of the air grid structure further includes:

a metal layer including metal and disposed below the air layers.

16. An image sensing device comprising:

a substrate including a photoelectric conversion element that produces an electrical signal in response to light incident to the photoelectric conversion element;

an air grid structure including a plurality of air layers that are stacked over the substrate along a direction perpendicular to a surface of the substrate and physically isolated from one another; and a color filter disposed at one side of the air grid structure and above the substrate, wherein the air grid structure further includes an isolation layer disposed between two adjacent air layers among the plurality of air layers, and wherein the isolation layer has a width which is the same as a width of a bottom surface of the air layer disposed below the isolation layer.

17. The image sensing device of claim 16, wherein the plurality of air layers includes a first air layer and a second air layer disposed over the first air layer and having a smaller width than that of the first air layer.

* * * * *